US012610833B2

(12) United States Patent (10) Patent No.: US 12,610,833 B2

Nuotio et al. (45) Date of Patent: Apr. 21, 2026

(54) POWER SEMICONDUCTOR PACKAGE

(71) Applicant: PIERBURG GMBH, Neuss (DE)

(72) Inventors: Mika Nuotio, San Jose, CA (US); Oguz Demir, Heilbronn (DE); Patrick Bauer, Hassmersheim (DE)

(73) Assignee: PIERBURG GMBH, Neuss (DE)

( * ) Notice: Subject to any disclaimer, the term of this patent is extended or adjusted under 35 U.S.C. 154(b) by 365 days.

(21) Appl. No.: 18/553,210

(22) PCT Filed: Feb. 25, 2022

(86) PCT No.: PCT/EP2022/054761

§ 371 (c)(1),
(2) Date: Sep. 29, 2023

(87) PCT Pub. No.: WO2022/207202

PCT Pub. Date: Oct. 6, 2022

(65) Prior Publication Data

US 2024/0178108 A1 May 30, 2024

Related U.S. Application Data

(63) Continuation of application No. PCT/EP2021/058654, filed on Apr. 1, 2021.

(51) Int. Cl.
H01L 23/495 (2006.01)
H01L 23/538 (2006.01)
(Continued)

(52) U.S. Cl.
CPC .. H01L 23/49562 (2013.01); H01L 23/49582 (2013.01); H01L 23/5385 (2013.01);
(Continued)

(58) Field of Classification Search
CPC ......... H01L 23/49562; H01L 23/49582; H01L 23/5385; H01L 23/5386; H01L 23/36;
(Continued)

(56) References Cited

U.S. PATENT DOCUMENTS

2005/0047186 A1* 3/2005 Gerbsch .............. H01L 23/5385
257/E23.172
2011/0057713 A1* 3/2011 Kawanami .............. H01L 25/16
361/728

(Continued)

FOREIGN PATENT DOCUMENTS

EP 3 621 106 A1 3/2020
JP 2005-303018 A 10/2005

*Primary Examiner* — Peniel M Gumedzoe

(74) *Attorney, Agent, or Firm* — Norman B. Thot

(57) ABSTRACT

A power semiconductor package includes a first substrate assembly with a power semiconductor die defining a high-side power switch, a second substrate assembly arranged parallel to the first substrate assembly which has a power semiconductor die defining a low-side power switch, and a power terminal assembly. The power terminal assembly includes a power terminal substrate arranged between the first and the second substrate assembly, a high-side drain power terminal electrically connected to an electrical drain circuit of the high-side power switch, a low-side source power terminal electrically connected to an electrical source circuit of the low-side power switch, and a mid-point power terminal electrically connected to an electrical source circuit of the high-side power switch and to an electrical drain circuit of the low-side power switch. The high-side drain power terminal, the low-side source power terminal, and the mid-point power terminal are each arranged on the power terminal substrate.

5 Claims, 13 Drawing Sheets

(51) Int. Cl.
   *H01L 25/07*        (2006.01)
   *H01L 25/16*        (2023.01)
   *H01L 23/00*        (2006.01)
   *H01L 23/36*        (2006.01)

(52) U.S. Cl.
   CPC ........ *H01L 23/5386* (2013.01); *H01L 25/074*
          (2013.01); *H01L 25/162* (2013.01); *H01L*
          *23/36* (2013.01); *H01L 23/49517* (2013.01);
          *H01L 24/48* (2013.01); *H01L 2224/48137*
          (2013.01); *H01L 2224/48225* (2013.01)

(58) Field of Classification Search
   CPC ............. H01L 23/49517; H01L 25/074; H01L
          25/162; H01L 24/48; H01L 2224/48137;
                              H01L 2224/48225
   See application file for complete search history.

(56)                    References Cited

U.S. PATENT DOCUMENTS

2019/0080992 A1      3/2019  Joos et al.
2021/0151416 A1      5/2021  Niu et al.
2021/0151417 A1*     5/2021  Strogies ............ H01L 23/49838

* cited by examiner

POWER SEMICONDUCTOR PACKAGE

CROSS REFERENCE TO PRIOR APPLICATIONS

This application is a U.S. National Phase application under 35 U.S.C. § 371 of International Application No. PCT/EP2022/054761, filed on Feb. 25, 2022 and which claims benefit to International Patent Application No. PCT/EP2021/058654, filed on Apr. 1, 2021. The International Application was published in English on Oct. 6, 2022 as WO 2022/207202 A1 under PCT Article 21(2).

FIELD

The present invention is directed to a power semiconductor package which defines a half-bridge electrical circuit with a high-side power switch and a low-side power switch, in particular to a power semiconductor package with a first substrate assembly which comprises at least one power semiconductor die defining the high-side power switch and with a second substrate assembly which is arranged substantially parallel to the first substrate assembly and which comprises at least one power semiconductor die defining the low-side power switch.

The present invention relates to high power density packaging of a plurality of power semiconductor dies having low power loop inductance, balanced parallel source inductances, high current handling capacity, high voltage creepage isolation, which can be manufactured at low cost using standard semiconductor packaging material, equipment and processes.

The present invention further relates to packaging of semiconductor power transistors and apparatus and methods used to maximize power density while simultaneously minimizing the parasitic power loop inductance of and matching the source inductance between parallel power semiconductor transistors within the power module package.

BACKGROUND

Improvements in power semiconductor transistor technologies have resulted in very fast transistor switching speeds on the order of tens of amperes within a few nanoseconds. Turn-off voltage overshoot caused by parasitic power loop inductances of power semiconductor packages may, however, limit otherwise achievable switching speeds.

Mismatches in parasitic common source inductances between parallel power semiconductor transistors can also cause imbalanced source-drain currents between paralleled transistors during turn-on and turn-off switching transients, which can result in non-uniform switching losses and non-uniform junction temperatures between paralleled transistors. The non-uniform switching losses result in reduced efficiency, and the non-uniform transistor junction temperatures effectively reduce the thermal performance of the power semiconductor package. Large imbalances of source-drain currents between paralleled transistors may also cause oscillations resulting in unstable operation.

A general goal of power semiconductor development is to increase their power density. This can be achieved by reduction of size and volume of such packages, and/or by improving the current and voltage ratings of the power semiconductor package. Achieving a reduction of size and volume while simultaneously increasing current and voltage ratings however introduces opposing constraints. Making packages smaller causes the available space for the power semiconductor package power terminals to shrink. This usually results in a reduction of power terminal conductor cross section area and thus in higher power terminal resistance. A reduction of the available space for power terminals usually also constrains high voltage operation due to smaller creepage spacing between adjacent power terminals, between high voltage signal terminals, as well as between high voltage power or signal terminals and semiconductor package cooling surfaces and heat sinks bonded thereto.

SUMMARY

An aspect of the present invention is to provide a relatively compact power semiconductor package which allows for a reliable switching of high electrical power.

In an embodiment, the present invention provides a power semiconductor package which defines a half-bridge electrical circuit comprising a high-side power switch and a low-side power switch. The power semiconductor package includes a first substrate assembly which comprises at least one power semiconductor die which defines the high-side power switch, a second substrate assembly which is arranged substantially parallel to the first substrate assembly and which comprises at least one power semiconductor die which defines the low-side power switch, and a power terminal assembly. The power terminal assembly comprises a power terminal substrate which is arranged between the first substrate assembly and the second substrate assembly, a high-side drain power terminal which is electrically connected to an electrical drain circuit of the high-side power switch, a low-side source power terminal which is electrically connected to an electrical source circuit of the low-side power switch, and a mid-point power terminal which is electrically connected to an electrical source circuit of the high-side power switch and to an electrical drain circuit of the low-side power switch. The high-side drain power terminal, the low-side source power terminal, and the mid-point power terminal are each arranged on the power terminal substrate.

BRIEF DESCRIPTION OF THE DRAWINGS

The present invention is described in greater detail below on the basis of embodiments and of the drawings in which.

DETAILED DESCRIPTION

Figure 1:
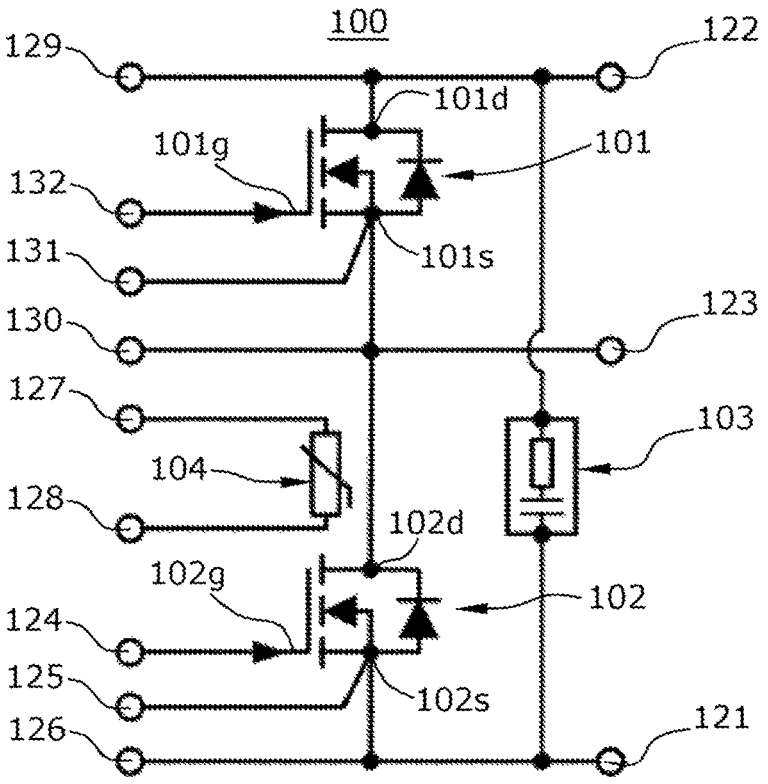
FIG. 1 illustrates a schematic electrical circuit diagram and a perspective view of a power semiconductor package according to the present invention.
Figure 1:
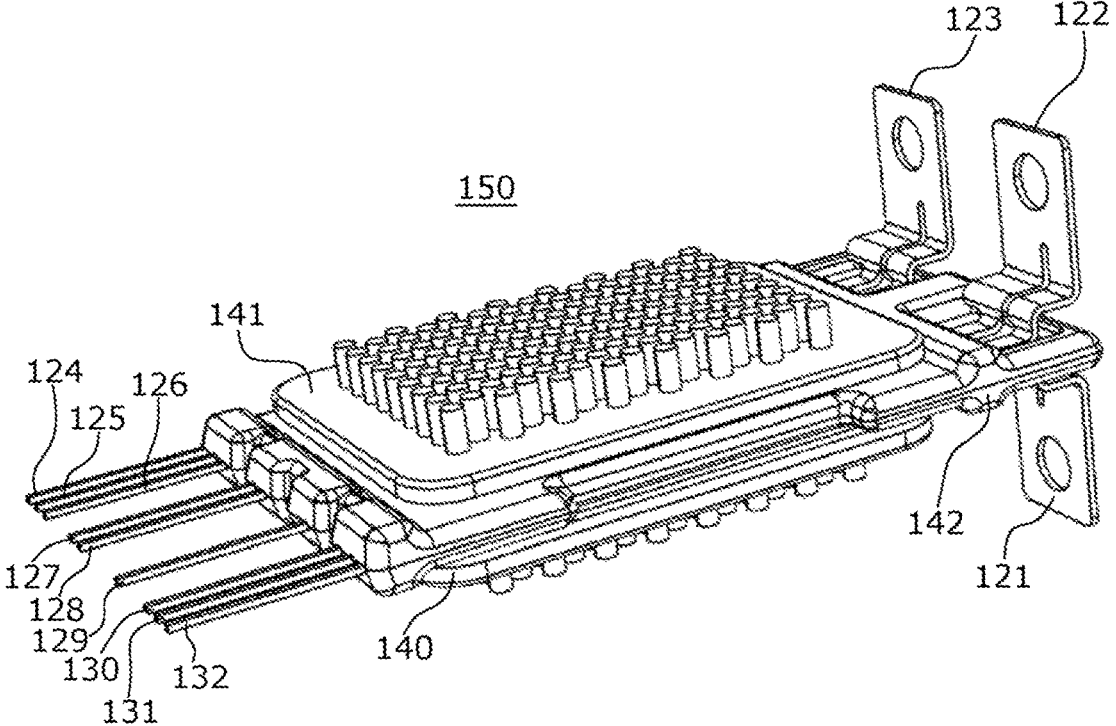

The power semiconductor package according to the present invention defines a half-bridge electrical circuit with a high-side power switch and a low-side power switch. Such half-bridge electrical circuits are well known in the art and are, for example, used in power converters and drive electronics of electric motors. The high-side power switch and the low-side power switch are each typically defined by a plurality of power semiconductors dies which are electrically connected in parallel to each other. The power semiconductor dies each comprise a semiconductor switch such as, for example, a metal-oxide-semiconductor-field-effect-transistor (MOSFET), an insulated-gate-bipolar-transistor (IGBT), or a high-electron-mobility-transistor (HEMT).

Each power semiconductor die comprises an input contact which is typically located at a top surface of the power semiconductor die, an output contact which is typically located at bottom surface of the power semiconductor die, and a control contact. The input contact corresponds to, for example, the source contact of a MOSFET, the emitter contact of an IGBT, or the source contact of a HEMT. The output contact corresponds to, for example, the drain contact of a MOSFET, the collector contact of an IGBT, or the drain contact of a HEMT. The control contact corresponds to, for example, the gate contact of a MOSFET, the base contact of an IGBT, or the gate contact of a HEMT.

For simplicity, hereinafter, the input contact is referred to as the source of the power semiconductor die, the output contact is referred to as the drain of the power semiconductor die, and the control contact is referred to as the gate of the power semiconductor die.

Electrically connecting power semiconductor dies in parallel to each other means electrically interconnecting the sources of all these power semiconductors dies by an electrical source circuit, electrically interconnecting the drains of all these power semiconductors dies by an electrical drain circuit, and electrically interconnecting the gates of all these power semiconductors dies by an electrical gate circuit.

For simplicity, hereinafter, the electrical source circuit of the power semiconductor dies which define the high-side power switch or the low-side power switch is referred to as the source of the respective power switch, the electrical drain circuit of these power semiconductor dies is referred to as the drain of the respective power switch, and the electrical gate circuit of these power semiconductor dies is referred to as the gate of the respective power switch.

The power semiconductor package according to the present invention is provided with two substrate assemblies which are arranged on top of each other so that the second substrate assembly is arranged substantially parallel to the first substrate assembly. The first substrate assembly comprises at least one power semiconductor die which defines the high-side power switch, and the second substrate assembly comprises at least one power semiconductor die which defines the low-side power switch. The first substrate assembly and the second substrate assembly each typically comprise a plurality of power semiconductors dies which are electrically connected in parallel to each other. The two substrate assemblies are configured so that the source of the high-side power switch is electrically connected to the drain of the low-side power switch.

Each substrate assembly typically comprises a copper cladding layer on the side which faces the respective other substrate assembly, wherein each copper cladding layer defines at least one copper cladding layer circuit. The copper cladding layers of the two substrate assemblies typically define at least a high-side drain copper cladding layer circuit which electrically interconnects the drains of all power semiconductor dies of the high-side power switch, a low-side source copper cladding layer circuit which electrically interconnects the sources of all power semiconductor dies of the low-side power switch, and a mid-point copper cladding layer circuit which electrically interconnects the sources of all power semiconductor dies of the high-side power switch as well as the drains of all power semiconductor dies of the low-side power switch.

The power semiconductor package according to the present invention is also provided with a power terminal assembly which comprises a power terminal substrate which is partially arranged between the first substrate assembly and the second substrate assembly, a high-side drain power terminal which is electrically connected to the electrical drain circuit of the high-side power switch, a low-side source power terminal which is electrically connected to the electrical source circuit of the low-side power switch, and a mid-point power terminal which is electrically connected to the electrical source circuit of the high-side power switch as well as to the electrical drain circuit of the low-side power switch.

According to the present invention, the high-side drain power terminal, the low-side source power terminal and the mid-point power terminal are each arranged on the power terminal substrate, in particular on that part of the power terminal substrate which is not located between the two substrate assemblies. The power terminal substrate can, for example, be provided with a copper cladding layer on both of its substrate-assembly-facing sides, wherein the power terminal copper cladding layers define a high-side drain power terminal copper cladding layer circuit, a low-side source power terminal copper cladding layer circuit, and a mid-point power terminal copper cladding layer circuit.

The high-side drain power terminal can, for example, be electrically conductively attached to the high-side drain power terminal copper cladding layer circuit which is electrically connected to the drain of the high-side power switch. The high-side drain power terminal copper cladding layer circuit can, for example, be bonded to the high-side drain copper cladding layer circuit of the respective substrate assembly.

The low-side source power terminal can, for example, be electrically conductively attached to the low-side source power terminal copper cladding layer circuit which is electrically connected to the source of the low-side power switch. The low-side source power terminal copper cladding layer circuit can, for example, be bonded to the low-side source copper cladding layer circuit of the respective substrate assembly.

The mid-point power terminal can, for example, be electrically conductively attached to the mid-point power terminal copper cladding layer circuit which is electrically connected to the source of the high-side power switch as well as to the drain of the low-side power switch. The mid-point power terminal copper cladding layer circuit can, for example, be bonded to the mid-point copper cladding layer circuit of the respective substrate assembly.

The power terminal assembly according to the present invention, in which all the power terminals are arranged on the power terminal substrate, which is in turn partially arranged between the two substrate assemblies, allows the power semiconductor package to be realized relatively compactly while still providing a relatively low electrical resistance of the power terminals. This provides a relatively compact power semiconductor package which allows reliable switching of high electrical power.

In an embodiment of the present invention, the power terminal assembly can, for example, comprise a copper cladding layer which defines a bonding area, wherein the bonding area of the copper cladding layer is machined so as to have a thickness tolerance of no more than ±50 μm, for example, of no more than ±30 μm, which means that the difference between minimum thickness of the copper cladding layer and the maximum thickness of the copper cladding layer within the bonding area is no more than 100 μm, for example, no more than 60 μm. This allows the power semiconductor package to be manufactured with a relatively high yield. The power terminal assembly can, for example, comprise two copper cladding layers which are separated from each other by an electrical isolator, and the power terminal assembly is machined so as to have a thickness tolerance of the total thickness of the power terminal assembly of no more than ±50 μm, for example, of no more than ±30 μm, within the bonding area. This means that the difference between the minimum total thickness of the power terminal assembly and the maximum total thickness of the power terminal assembly within the bonding area is no more than 100 μm, for example, no more than 60 μm. The desired thickness tolerance of the total thickness can be realized either by machining only one of the copper cladding layers or by machining both of the copper cladding layers.

The high-side drain power terminal and the low-side source power terminal can, for example, be arranged on opposite sides of the power terminal substrate. This allow the power terminal assembly and thus the power semiconductor package to be realized particularly compactly. Arranging the high-side drain power terminal and the low-side source power terminal on opposite sides of the power terminal substrate furthermore provides for a mutual inductance coupling between these power terminals which decreases the total power loop conductance of the power semiconductor package.

The power terminal assembly can, for example, comprise a high-side drain power terminal copper cladding layer circuit and a low-side source power terminal copper cladding layer circuit as described above, wherein the high-side drain power terminal copper cladding layer circuit is arranged on a first side of the power terminal substrate and the low-side source power terminal copper cladding layer circuit is arranged on a second side of the power terminal substrate which is opposite to the first side of the power terminal substrate. The high-side drain power terminal copper cladding layer circuit and the low-side source power terminal copper cladding layer circuit are in particular arranged on the opposite sides of the power terminal substrate so that their orthogonal projections onto a surface of the power terminal substrate overlap. The high-side drain power terminal copper cladding layer circuit is electrically connected to the low-side source power terminal and to the drain of the high-side power switch, and the low-side source power terminal copper cladding layer circuit is electrically connected to the low-side source power terminal and to the source of the low-side power switch. Since the high-side drain power terminal copper cladding layer circuit and the low-side source power terminal copper cladding layer circuit are substantially parallel and relatively close to each other, the mutual inductance coupling between the high-side drain power terminal and the low-side source power terminal is particularly strong, which allows a power semiconductor package with a particularly low total power loop conductance to be provided.

The present invention, which includes improvements to the packaging of a plurality of parallel semiconductor power dies describes embodiments that enable power semiconductor dies to operate at optimum performance, power density, and cost.

The present invention, which describes improvements to packaging and cooling structures, describes embodiments that allow the package semiconductor power transistors to be more efficient, reliable, higher power density and more cost effective.

Embodiments of the present invention and their advantages are best understood by referring to the detailed description of the figures set forth below. It should thereby be appreciated that like reference numerals are thereby used to identify like elements illustrated in one or more of the figures, wherein the information there shown is for purposes of illustrating embodiments of the present invention and not for purposes of limiting the same.

FIG. 1 schematically illustrates a power semiconductor half-bridge electrical circuit 100 of a high-side power switch 101 and a low-side power switch 102. In certain embodiments, each of the two power switches 101 and 102 comprises a plurality of parallel connected power semiconductor dies, further comprising one or more power semiconductor transistors and one or more power semiconductor diodes. In certain embodiments, each of the plurality of parallel connected semiconductor die may comprise a transistor having an intrinsic anti-parallel diode. In other embodiments, some of the plurality of parallel connected power semiconductor die may comprise a transistor and other parallel connected power semiconductor die may comprise an anti-parallel diode. In certain embodiments, the semiconductor transistors comprise a metal-oxide-semiconductor-field-effect-transistor MOSFET, an insulated-gate-bipolar-transistor IGBT, or a high-electron-mobility-transistor HEMT. In certain embodiments, the MOSFET, IGBT, and HEMT transistors and anti-parallel diodes may be formed from silicon, silicon carbide, gallium nitride, another III-V semiconductor, or other semiconductor materials. The bottom side power semiconductor die surface corresponding to the drain of MOSFET transistors, drain of HEMT transistors, collector of IGBT transistors, and the cathode of anti-parallel diodes will hereinafter be referred to as the drain connection of each die. The drain connections of the plurality of the power semiconductor die comprising the high-side power switch 101 are electrically connected in parallel to the drain 101d of the high-side power switch 101. The source connections of the plurality of power semiconductor die comprising the high-side power switch 101 are electrically connected in parallel to the electrical source current 101s of the high-side power switch 101. The top side power semiconductor die surface exposed pad area corresponding to the source of MOSFET transistors, source of HEMT transistors, emitter of IGBT transistors, and anode of anti-parallel diodes will hereinafter be referred to as the source connection of each die. The drain connections of the plurality of the power semiconductor die comprising the low-side power switch 102 are electrically connected in parallel to the drain 101d of the low-side power switch 102. The source connections of the plurality of power semiconductor die comprising the low-side power switch 102 are electrically connected in parallel to the electrical source current 102s of the low-side power switch 102. In certain exemplary embodiments, the drain 101d of the high-side power switch 101 is electrically connected to a high-side drain power terminal 122 and signal terminal 129. In certain exemplary embodiments, the electrical source current 102s of the low-side power switch 102 is electrically connected to a low-side source power terminal 121 and signal terminal 126. In certain exemplary embodiments, the electrical source current 101s of the high-side power switch 101 and drain 102d of the low-side power switch 102 are electrically connected to a mid-point power terminal 123 and high-side source/low-side drain signal terminal 130. The common electrical gate circuit 101g for the power semiconductor transistor dies comprising the high-side power switch 101 is electrically connected to signal pin 132. In certain exemplary embodiments, a common Kelvin source circuit for the power semiconductor dies comprising the high-side power switch 101 forms an electrical connection between 101s and signal terminal 131. The common electrical gate circuit 102g for the power semiconductor transistor dies for the low-side switch 102 is electrically connected to signal terminal 124. In certain exemplary embodiments, a common Kelvin source circuit for the power semiconductor dies comprising the low-side power switch 102 forms an electrical connection between 101s and signal terminal 131. In certain exemplary embodiments, the semiconductor package of the present invention includes a thermistor 104 having its first terminal electrically connected to signal terminal 127 and second terminal electrically connected to signal terminal 128. In certain exemplary embodiments, the semiconductor package of the present invention includes a plurality of resistive-capacitive RC snubber capacitor 103 having their terminals electrically connected between the drain 101d of the high-side power switch and electrical source circuit 102s of the low-side power switch 102. An exemplary embodiment of the final power semiconductor package structure 150 comprises a plurality of signal terminals on one side of the package, a plurality of power terminals 124~132 on the opposite side of the package, a plastic encapsulant body 142, a bottom side heatsink 140, and a top side heatsink 141.

Figure 2:
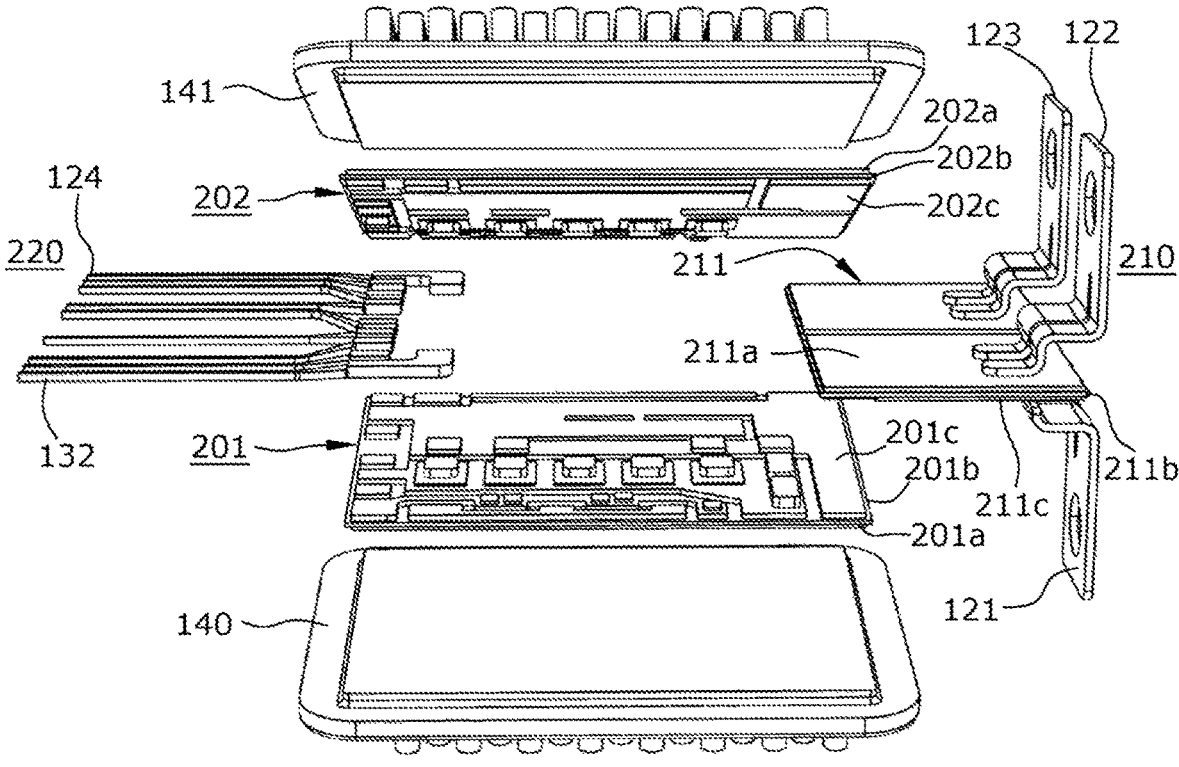
FIG. 2 illustrates an explosion illustration of components and subassemblies of the power semiconductor package of FIG. 1.

FIG. 2 illustrates the sub-assemblies and components comprising the semiconductor package structure of the present invention, not including the plastic encapsulant body 142. The semiconductor package structure comprises a first substrate assembly 201, a second substrate assembly 202, a signal terminal lead frame 220, a power terminal assembly 210, a bottom side heatsink 140, and an top side heatsink 141. The first substrate assembly 201, having an exemplary external copper cladding layer 201a, exemplary internal copper cladding layer 201c, the external and internal copper cladding layers being separated by an electrical isolation layer 201b. The second substrate assembly 202 has an exemplary external copper cladding layer 202a, exemplary internal copper cladding layer 202c, the external and internal copper cladding layers being separated by an electrical isolation layer 202b. The signal terminal lead frame comprises a plurality of signal terminals 124~132 made from copper or a copper alloy material. The exemplary power terminal assembly 210 comprises a power terminal substrate 211 having an exemplary first copper cladding layer 211a, an exemplary second copper cladding layer 211c, the first and second copper cladding layers being separated by an electrical isolation layer 211b, and a plurality of copper or copper alloy terminals 121~123 bonded to the first and second copper cladding layers.

Figure 3A:
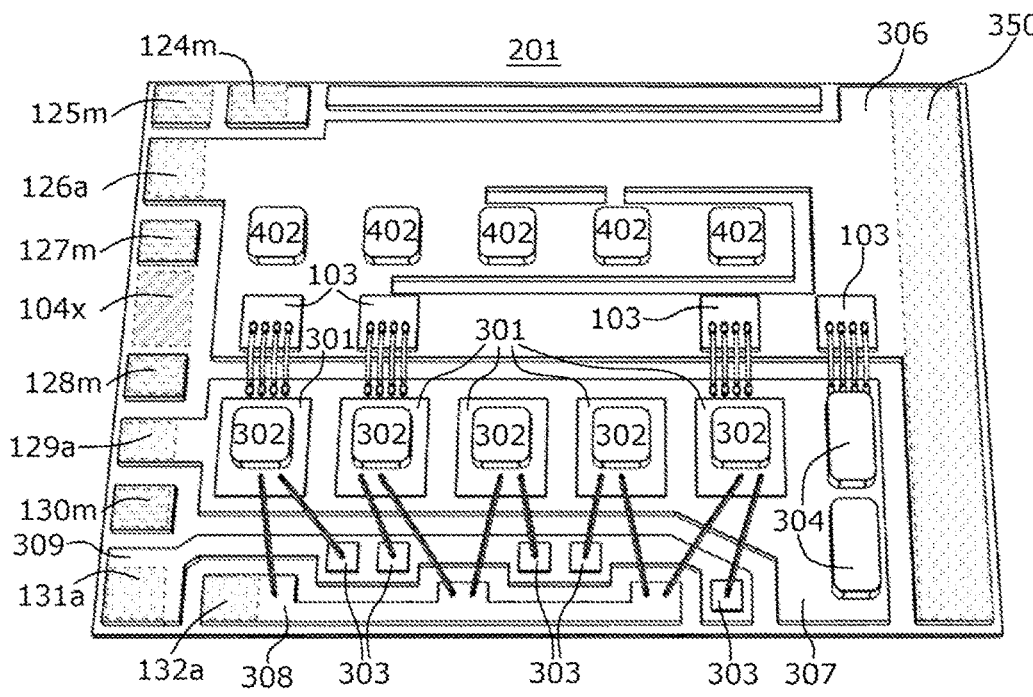
FIG. 3A illustrates a top view of an internal side of a first embodiment of a first substrate assembly of the semiconductor package of FIG. 1.

FIG. 3A illustrates an exemplary first substrate assembly 201. An exemplary copper cladding layer circuit 307 forms the electrical drain circuit 101d of the high-side power switch 101. An exemplary copper cladding layer circuit 306 forms the electrical source circuit 102s of the low-side power switch 102.

An exemplary high-side power switch 101 comprises five parallel power semiconductor transistor dies 301 with intrinsic anti-parallel diodes, each power semiconductor transistor die 301 having its drain connection bonded to the electrical drain circuit 101d copper cladding layer circuit. Other exemplary implementations may use fewer or more power semiconductor transistor dies 301 in parallel. A vertical source contact 302 is bonded to the source connection of each such exemplary power semiconductor transistor die 301.

An exemplary copper cladding layer circuit 308 forms a common electrical gate circuit 101g for the high side power switch 101, having exemplary individual bond wire connections for each power semiconductor transistor die 301. An exemplary bonding area 132a is illustrated for bonding of the external gate signal terminal 132 to common gate circuit copper cladding layer circuit 308.

An exemplary copper cladding layer circuit 309 forms a common Kelvin source circuit for the power semiconductors comprising the high-side power switch 101. An exemplary implementation of such common Kelvin source circuit comprises a plurality of current limiting resistors 303, each having one terminal bonded to the common Kelvin source copper cladding layer circuit 309 and a second terminal wire bonded to the source pad of each power semiconductor transistor die 301. An exemplary bonding area 131a is illustrated for bonding of the external Kelvin source signal terminal 131 to common Kelvin source circuit copper cladding circuit 309. Using current limiting resistors may be required in certain exemplary embodiments to prevent excessive recirculating Kelvin source currents between parallel power semiconductor transistors from fusing Kelvin source bond wires. The magnitude of such recirculating currents could be excessively high in applications having high di/dt switching transients and a large threshold voltage mismatch between parallel connected power semiconductor transistor dies 301. Exemplary bonding area 128*m* supports mechanical bonding of the second thermistor signal terminal to the first substrate assembly 201. Exemplary area void of copper cladding layer 104*x* provides vertical mechanical bond wire clearance for thermistor 104 assembled on the second substrate. Exemplary bonding area 127*m* supports mechanical bonding of the second thermistor signal terminal to the first substrate assembly 201. Exemplary bonding area 126*a* supports electrical and mechanical bonding of the low-side source common signal terminal 126 to the first substrate assembly 201. Exemplary bonding area 125*m* supports mechanical bonding of the low-side Kelvin source signal terminal 125 to the first substrate assembly 201. Exemplary bonding area 124*m* supports mechanical bonding of the low-side gate signal terminal 124 to the first substrate assembly 201.

The bonding area 124*m* for the first signal terminal 124 and the bonding area 132*a* of the last signal terminal 132 of the present invention are each horizontally offset relative to the other signal terminal bonding areas and placed on the substrate sides perpendicular to the signal terminal side of the substrate. The advantages of such placements are that i) no increase is required to the width of the first 201 or second 202 substrate assemblies to support the number of exemplary signal terminals and ii) the exemplary thermistor can be placed within the lead frame bonding width using no additional area of the first 201 or second 202 substrate assemblies.

An exemplary electrical and mechanical bonding location on the first substrate assembly 201 for a plurality of vertical source contacts 402 for each power semiconductor transistor die source connection of the second substrate assembly 202.

Certain exemplary embodiments of the present invention incorporate a plurality of resistive-capacitive RC snubber capacitors 103 each having a first, bottom side terminal electrically and mechanically bonded to the copper cladding layer circuit 306 forming the electrical source circuit 102*s* of the low side power switch 102 and a second, top side terminal wire bonded to copper cladding layer circuit 307 forming the electrical drain circuit 101*d* of the high-side power switch 101. An advantage of the present invention is that each of the plurality of RC snubber capacitors 103 use separate, minimal length bond wires, resulting in minimal parasitic inductance and improved filtering performance. Other exemplary embodiments may omit such RC snubber capacitors 103.

An exemplary plurality of vertical power contacts 304 electrically and mechanically connect the electrical drain circuit 101*d* of the high-side power switch 101 between the first 201 and second 202 substrate assemblies.

An exemplary electrical and mechanical bonding area 350 for the electrical source circuit 102*s* of the low-side power switch 102 on the first substrate assembly 201 and corresponding circuit on the second copper cladding layer 211*c* of the power terminal substrate 211.

Figure 3B:
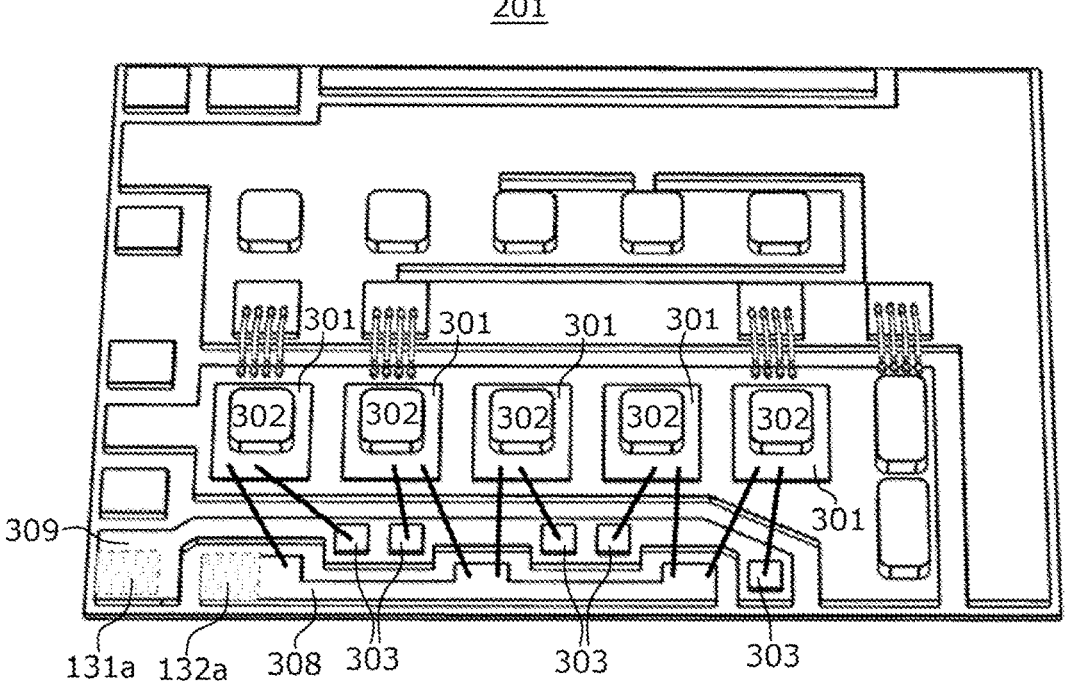
FIG. 3B illustrates a top view of an internal side of an alternative second embodiment of the first substrate assembly of the semiconductor package of FIG. 1.

FIG. 3B illustrates an alternate exemplary embodiment of bond wire configurations for the gate and Kelvin source circuits. An external gate control signal may be connected to signal terminal 131 having the bond wire from each resistor 303 connected to the gate pad of each respective power semiconductor transistor die 301. In such alternate embodiment, the bond wire associated with the source pad for each semiconductor power semiconductor transistor die 301 may be bonded to copper cladding layer circuit 308 and further connected to external signal terminal 132 forming a common Kelvin source return. Such alternate wire bonding configuration would provide increased gate resistance for each power semiconductor transistor die to mitigate parasitic gate-drain oscillations when using semiconductor power semiconductor transistor dies 301 having low gate-drain to gate-source capacitance ratios. Other exemplary embodiments may omit resistors 303 altogether.

The high-side common source signal terminal 130 is mechanically bonded to bonding area 130*m* on the first substrate assembly 201. The opposite side of the high-side common source signal terminal 130 is electrically and mechanically bonded to the high-side common electrical source circuit 101*s* on the second substrate. Both the Kelvin source as well as the common source gate return electrical circuits are connected to external signal terminals of the semiconductor package of the present exemplary invention. Use may be made of the common source return signal on high-side common source signal terminal 130 for partially hard switched and soft switched application circuits, whereas use of the external Kelvin source signal terminal 131 may, for example be used in hard switching application circuits. An advantage of the gate control and source return circuits of the present invention includes support for both Kelvin source and common source application circuits with the same semiconductor package. Another advantage includes simple bond wire configuration of resistors for current limiting or supplemental gate resistance adaptations using the same signal terminal and substrate materials resulting in improved economies of scale.

Figure 4:
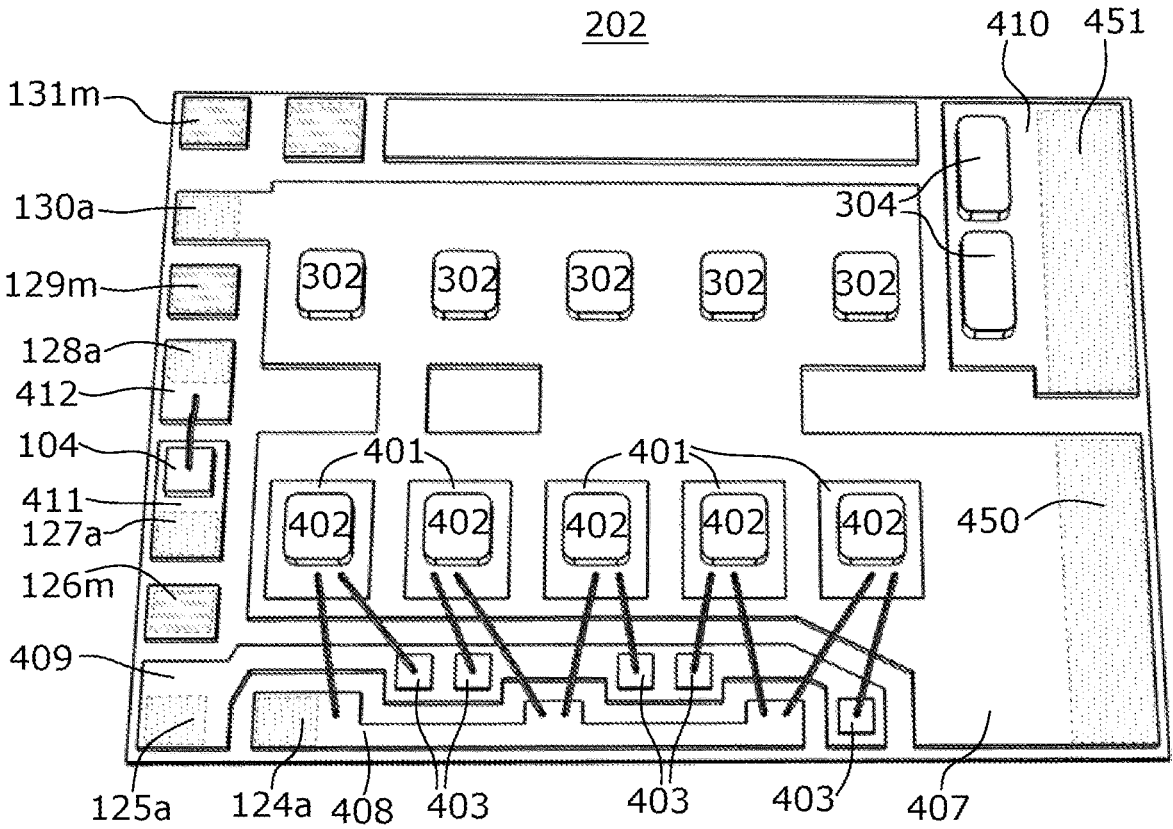
FIG. 4 illustrates a top view of an internal side of a second substrate assembly of the semiconductor package of FIG. 1.

FIG. 4 illustrates an exemplary second substrate assembly 202. An exemplary copper cladding layer circuit 407 forms the electrical drain circuit 102*d* of the low-side power switch 102 and electrical source circuit 101*s* of the high-side power switch 101. An exemplary copper cladding layer circuit 410 connects the electrical drain circuit 101*d* of the high-side power switch 101 through vertical power contacts 304 from the first substrate assembly 201 to an exemplary electrical and mechanical bonding area 451 to the corresponding circuit on the second copper cladding layer 211*c* of the power terminal substrate 211.

An exemplary low-side power switch 102 comprises five parallel power semiconductor transistor dies 401 with intrinsic anti-parallel diodes, each power semiconductor transistor die 401 having its drain connection bonded to the electrical drain circuit 102*d* copper cladding layer circuit 407. Other exemplary embodiments may use fewer or more power semiconductor transistor dies 401 in parallel. A vertical source contact 402 is bonded to the source connection of each such exemplary power semiconductor transistor die 401.

An exemplary copper cladding layer circuit 408 forms a common electrical gate circuit 102*g* for the low-side power switch 102, having exemplary individual bond wire connections for each power semiconductor transistor die 401. An exemplary bonding area 124*a* is illustrated for bonding of the external gate signal terminal 124 to common gate circuit copper cladding layer circuit 408.

An exemplary copper cladding layer circuit 409 forms a common Kelvin source circuit for the power semiconductors comprising the low-side power switch 102. An exemplary implementation of such common Kelvin source circuit comprises a plurality of current limiting resistors 403, each having one terminal bonded to the common Kelvin source copper cladding layer circuit 409 and a second terminal wire bonded to the source pad of each power semiconductor transistor die 401. An exemplary bonding area 125*a* is illustrated for bonding of the external Kelvin signal terminal 125 to common Kelvin source circuit copper cladding layer circuit 409. The low-side common source signal terminal 126 is mechanically bonded to bonding area 126m on the second substrate assembly 202. The opposite side of signal terminal 126 is electrically and mechanically bonded to the low-side common electrical source circuit 102s on the first substrate. The exemplary gate circuit, Kelvin source circuit, common source circuit on this second substrate is symmetrical to the exemplary circuits in FIG. 3A and FIG. 3B disclosed for the first substrate. All exemplary embodiments and advantages disclosed for the corresponding circuit configurations on the first substrate are directly applicable to the second substrate.

Exemplary bonding area 127a on copper cladding circuit 411 supports electrical and mechanical bonding of the first thermistor signal terminal to the second substrate assembly 202. A first terminal on the bottom of the exemplary thermistor 104 is bonded to copper cladding circuit 411. An exemplary bond wire connects the second terminal on the top of the exemplary thermistor 104 to copper cladding layer circuit 412. Exemplary bonding area 128a on copper cladding circuit 411 supports electrical and mechanical bonding of the second thermistor signal terminal to the second substrate assembly 202. An advantage of the exemplary structure forming the bonding and signal pin connections for the thermistor is that such a structure is electrically isolated from high voltage circuits of the present semiconductor package. Another advantage of such a structure is that the thermistor 104 is geometrically placed near a low-side power semiconductor transistor die 401 thereby resulting in improved temperature correlation of thermistor 104 and power semiconductor transistor die 401. Exemplary bonding area 129m supports mechanical bonding of the high-side drain signal terminal 129 to the second substrate assembly 202. Exemplary bonding area 130a supports electrical and mechanical bonding of the low-side source signal terminal 130 to the second substrate assembly 202. Exemplary bonding area 131m supports mechanical bonding of the low-side external Kelvin source signal terminal 131 to the second substrate assembly 202 in some embodiments of the present invention. Exemplary bonding area 132m supports mechanical bonding of the low-side gate signal terminal 132 to the second substrate assembly 202 in some embodiments of the present invention.

The bonding area 124m for the first signal terminal 124 and the bonding area 132a for the last signal terminal 132 to the second substrate assembly 202 of the present invention are each horizontally offset relative to the other signal terminal bonding areas and placed on the substrate sides perpendicular to the signal terminal side of the substrate. The advantages of such placements are that i) no increase is required to the width of the first 201 or second 202 substrate assemblies to support the number of exemplary signal terminals and ii) the exemplary thermistor can be placed within the lead frame bonding width using no additional area of the first 201 or second 202 substrate assemblies.

An exemplary electrical and mechanical bonding location on the second substrate assembly 202 for a plurality of vertical source contacts 302 for each power semiconductor transistor die source connection of the first substrate assembly 201.

An exemplary plurality of vertical power contacts 304 of the first substrate assembly 201 electrically and mechanically connect the electrical drain circuit 101d of the high-side power switch 101 from the first substrate assembly 201 to copper cladding layer circuit 410 on the second substrate assembly 202.

An exemplary electrical and mechanical bonding area 451 on copper cladding layer circuit 410 connects the electrical drain circuit 101d of the high-side power switch 101 on the second substrate assembly 202 to a corresponding first copper cladding layer 211a of the power terminal substrate 211.

An exemplary bonding area 450 supports electrical and mechanical bonding of electrical drain circuit 102d of the low-side power switch 102 to a corresponding first copper cladding layer 211a of the power terminal substrate 211.

Figure 5:
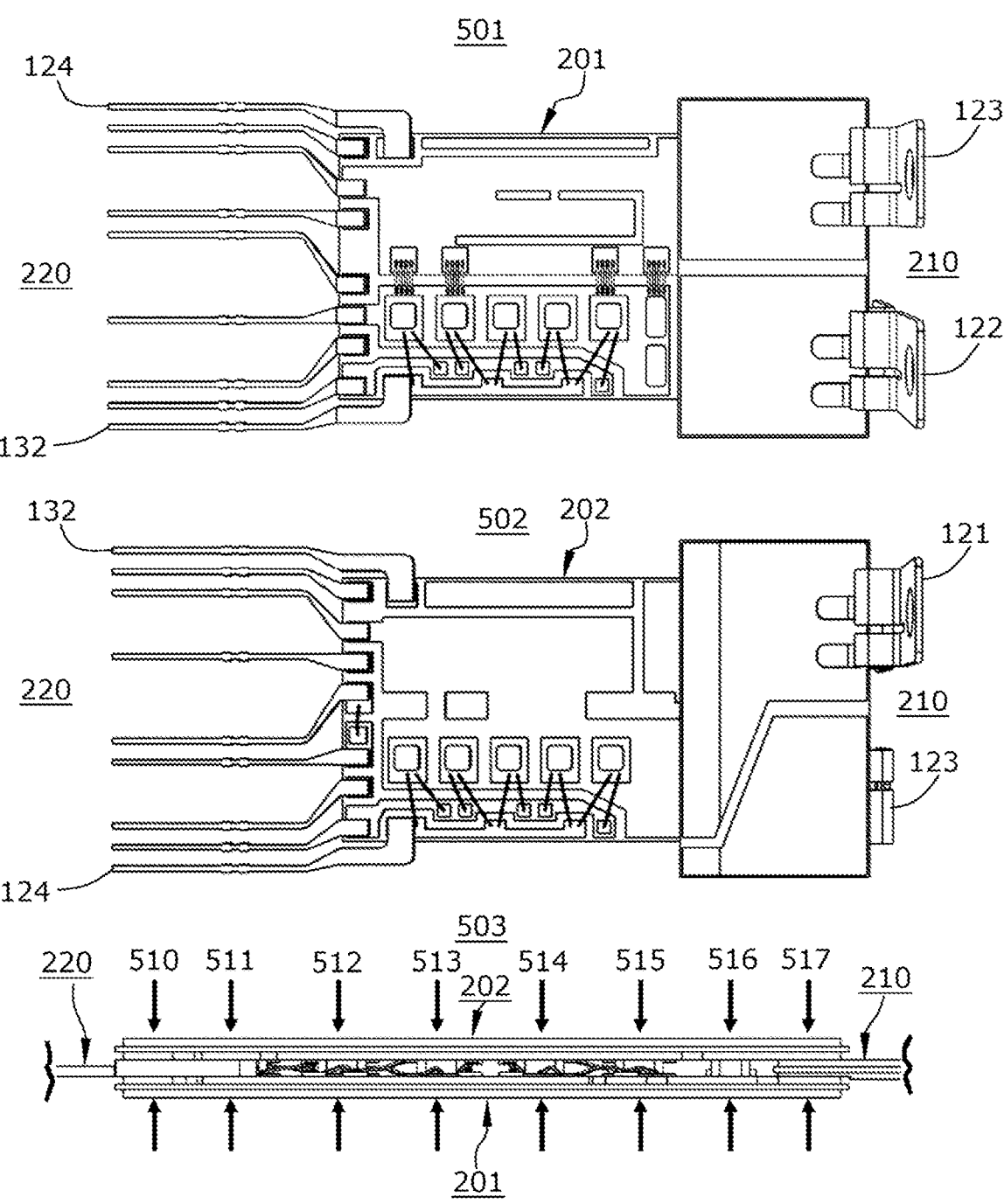
FIG. 5 illustrates alignment of the first substrate assembly, the second substrate assembly, a signal terminal lead frame, and a power terminal assembly of the semiconductor package of FIG. 1 relative to each other when assembled.

FIG. 5 illustrates how the first substrate assembly 201, second substrate assembly 202, signal terminal lead frame 220, and power terminal assembly 210 are aligned relative to each other when assembled in one exemplary embodiment of the present invention.

Illustration 501 shows an exemplary horizontal, x-y plane, alignment of the signal terminal lead frame 220, first substrate assembly 201, and power terminal assembly 210.

Illustration 502 shows an exemplary horizontal, x-y dimension, alignment of the signal terminal lead frame 220, second substrate assembly 202, and power terminal assembly 210.

Illustration 503 shows an exemplary assembly of the signal terminal lead frame 220, first substrate assembly 201, second substrate assembly 202, and power terminal assembly 210. Arrows 510~517 schematically illustrate the approximate positions of various bonds formed during assembly. Bond position 510 illustrates the bonds formed between the upper and lower surfaces of the signal terminal lead frame 220 and the corresponding plurality of bonding areas 125a~131a and 125m~131m on the first and second substrate. Bond position 511 illustrates the bonds formed between the upper and lower surfaces of signal terminal 124 and 132 and the corresponding plurality of bonding areas 124a, 124m, 132a, and 132m on the first and second substrate. Bond position 511 also illustrates the bonds formed between i) the leftmost vertical source contact 302 of the first substrate assembly 201 and its corresponding bonding position on the second substrate assembly 202 and ii) the leftmost vertical source contact 402 of the second substrate assembly 202 and its corresponding bonding position on the first substrate assembly 201. Bond positions 512~515 illustrates the bonds formed between i) the remaining vertical source contacts 302 of the first substrate assembly 201 and their corresponding bonding positions on the second substrate assembly 202 and ii) the remaining vertical source contacts 402 of the second substrate assembly 202 and their corresponding bonding positions on the first substrate assembly 201. Bond position 516 illustrates the bonds formed between the vertical power contacts 304 of the first substrate assembly 201 to their corresponding bonding positions on the second substrate assembly 202. Bond position 517 illustrates the bonds formed between i) bonding area 350 of the first substrate assembly 201 and corresponding bonding area 350a of the power terminal assembly 210 and ii) bonding areas 450 and 451 of the second substrate assembly 202 and corresponding bonding areas 450a and 451a of the power terminal assembly 210.

Advantages of the power semiconductor package structure of the present invention related to the assembly process include: i) assembly of the first and 201 and second 202 substrate assemblies only require assembly tolerance control in the horizontal, x-y dimension, such tolerances being well within the capabilities of industry standard power semiconductor packaging equipment and processes; ii) assembly of the first substrate assembly 201, second substrate assembly 202, signal terminal lead frame 220, and power terminal assembly 210 has significantly reduced horizontal, x-y dimension tolerance requirements compared with assembly tolerances for assembly of first 201 and second 202 substrate assemblies; and, iii) strict vertical, z-assembly dimension tolerances required for assembly of the first substrate assembly 201, second substrate assembly 202, signal terminal lead frame 220, and power terminal assembly 210 are readily achieved with industry standard thickness tolerances for signal terminal lead frame 220, power semiconductor transistor dies 301 and 401, vertical source contacts 302 and 402, and vertical power contacts 304. Only the power terminal substrate 211 requires non-standard processing to meet required thickness tolerances.

Figure 6A:
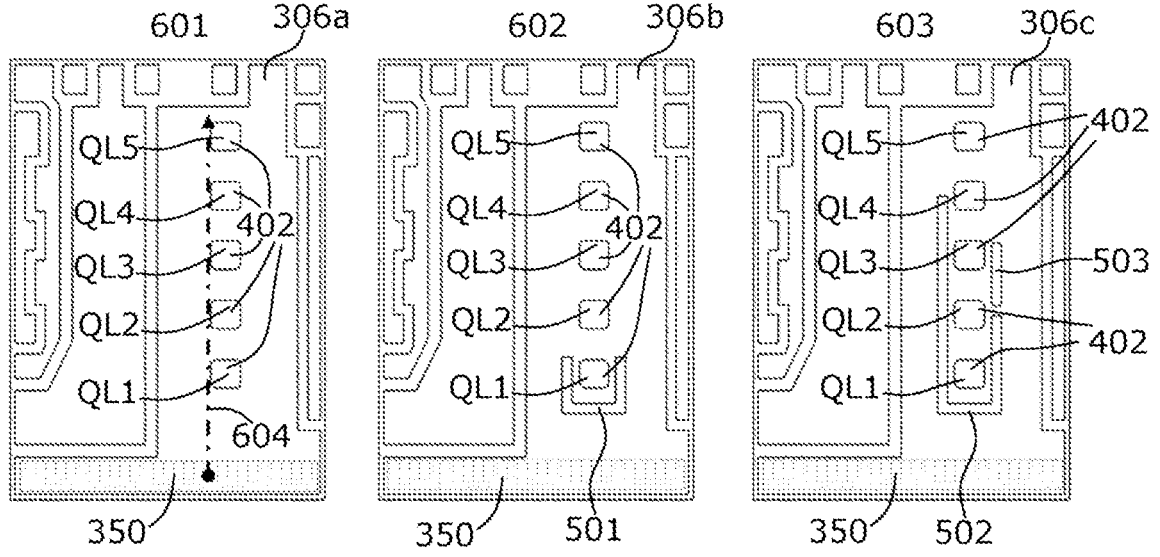
FIG. 6A illustrates different embodiments of copper cladding layer layouts of the first substrate assembly of the semiconductor package of FIG. 1.

FIG. 6A illustrates three exemplary embodiments of the copper cladding layer circuit 306 of the first substrate assembly 201 forming an electrical source circuit 102*s* of the low-side power switch 102.

Illustration of exemplary embodiment 601 shows five vertical source contacts 402 bonded to exemplary copper cladding circuit 306*a* the plurality of vertical source contacts 402 assembled substantially in line with the power terminal substrate 211 bonding area 350 as illustrated by 604. The position of each vertical source contact is labeled QL1~QL5 with QL1 being geometrically closest to bonding area 350 and QL5 being geometrically furthest from bonding area 350.

Illustration of exemplary embodiment 602 introduces a modified electrical source circuit 102*s* copper cladding layer circuit 306*b* having an electrically isolating slot 501 with a continuous span around the periphery of three sides of the vertical source contact 402 geometrically closest QL1 to bonding area 350. The advantage of such isolating slot 501 is to improve matching between the parallel parasitic source inductances between power terminal substrate 211 bonding area 350 and the plurality of vertical source contacts QL1~QL5.

Illustration of exemplary embodiment 603 introduces a modified electrical source circuit 102*s* copper cladding layer circuit 306*c* having two electrically isolating slots. A first electrically isolating slot 502 with a continuous span around the periphery of three sides of the vertical source contact 402 geometrically closest QL1 to bonding area 350 such slot span being extended to QL4 on one side and to QL2 on a second side. A second electrically isolating slot 503 with a span from QL2 to QL3. The advantage of such isolating slots 502 and 503 is to further improve matching between the parallel parasitic source inductances between power terminal substrate 211 bonding area 350 and the plurality of vertical source contacts QL1~QL5.

Figure 6B:
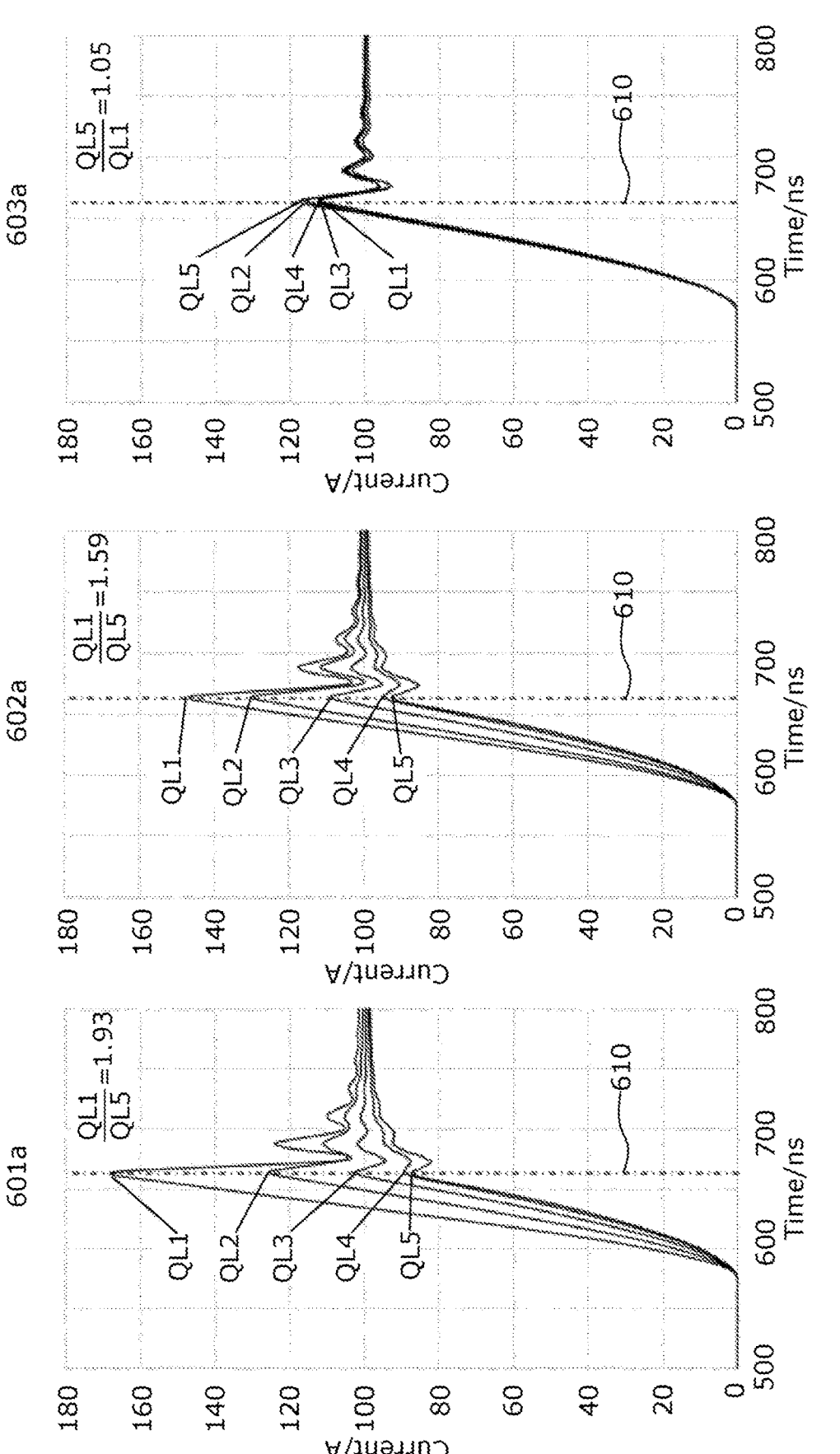
FIG. 6B illustrates exemplary turn-on current switching waveforms of power semiconductor dies of a low-side power switch of the semiconductor package of FIG. 1.

FIG. 6B illustrates circuit simulation results of turn-on currents for each parallel power semiconductor die bonded to vertical source contacts QL1-QL5 for each exemplary copper cladding layer geometries 306*a*, 306*b*, and 306*c* of FIG. 6A.

Illustration 601*a* shows the turn-on currents for QL1~QL5 for copper cladding circuit 306*a*. QL1 exhibits the highest peak current at a time indicated by line 610. At time instant 610, the ratio of the highest turn on current for QL1 over the lowest turn on current for QL5 is 1.93.

Illustration 602*a* shows the turn-on currents for QL1~QL5 for copper cladding circuit 306*b*. QL1 still exhibits the highest peak current at a time indicated by line 610. At time instant 610, the ratio of the highest turn on current for QL1 over the lowest turn on current for QL5 is reduced to 1.59.

Illustration 603*a* shows the turn-on currents for QL1~QL5 for copper cladding circuit 306*c*. QL5 now exhibits the highest peak current at a time indicated by line 610. At time instant 610, the ratio of the highest turn on current for QL5 over the lowest turn on current for QL1 is reduced to 1.05.

Exemplary embodiments of the present invention incorporating exemplary isolating slots 501, 502, and 503 of the present invention provide a balanced current sharing between exemplary parallel power semiconductor transistor dies 301 during dynamic switching conditions. Balanced current sharing minimizes differential switching losses between exemplary power semiconductor transistors dies 301 thereby resulting in uniform power semiconductor transistor die 301 temperatures and improved efficiency.

Figure 7A:
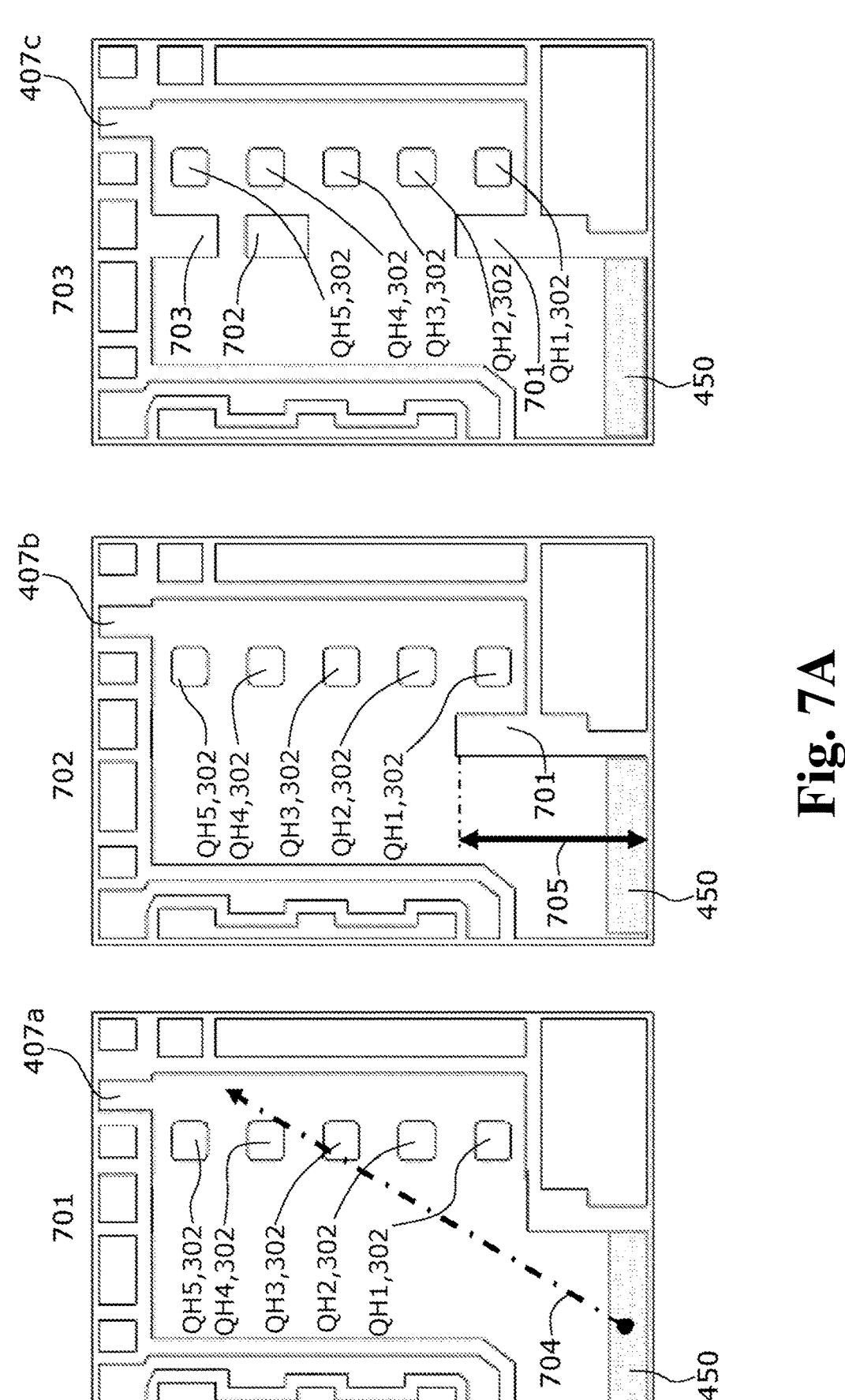
FIG. 7A illustrates different embodiments of copper cladding layer layouts of the second substrate assembly of the semiconductor package of FIG. 1.

FIG. 7A illustrates three exemplary embodiments of the copper cladding layer circuit 407 of the second substrate assembly 202 forming an electrical source circuit 101*s* of the high-side power switch 101.

Illustration of exemplary embodiment 701 shows five vertical source contacts 302 bonded to exemplary copper cladding circuit 407*a* the plurality of vertical source contacts 302 assembled substantially diagonal to the power terminal substrate 211 bonding area 450 as illustrated by 704. The position of each vertical source contact is labeled QH1~QH5 with QH1 being geometrically closest to bonding area 450 and QH5 being geometrically furthest from bonding area 450.

Illustration of exemplary embodiment 702 introduces a modified electrical source circuit 101*s* copper cladding layer circuit 407*b* having a first electrically isolating slot 701 with a continuous span illustrated by 705 from the edge of the copper cladding layer adjacent to bonding area 450 through the width of the vertical source contact 302 geometrically closest QH1 to bonding area 450. The advantage of such an isolating slot 501 is to improve matching between the parallel parasitic source inductances between power terminal substrate 211 bonding area 450 and the plurality of vertical source contacts QH1~QH5.

Illustration of exemplary embodiment 703 introduces a modified electrical source circuit 101*s* copper cladding layer circuit 407*c* having three electrically isolating slots. A first electrically isolating slot 701 with a continuous span from the edge of the copper cladding layer adjacent to bonding area 450 through the width of the vertical source contact 302 geometrically closest QH1 to bonding area 450. A second electrically isolating slot 702 is adjacent to QH4. A third electrically isolating slot 703 is adjacent to QH5. The advantage of such isolating slots 701, 702, and 703 is to further improve matching between the parallel parasitic source inductances between power terminal substrate 211 bonding area 450 and the plurality of vertical source contacts QH1~QH5.

Figure 7B:
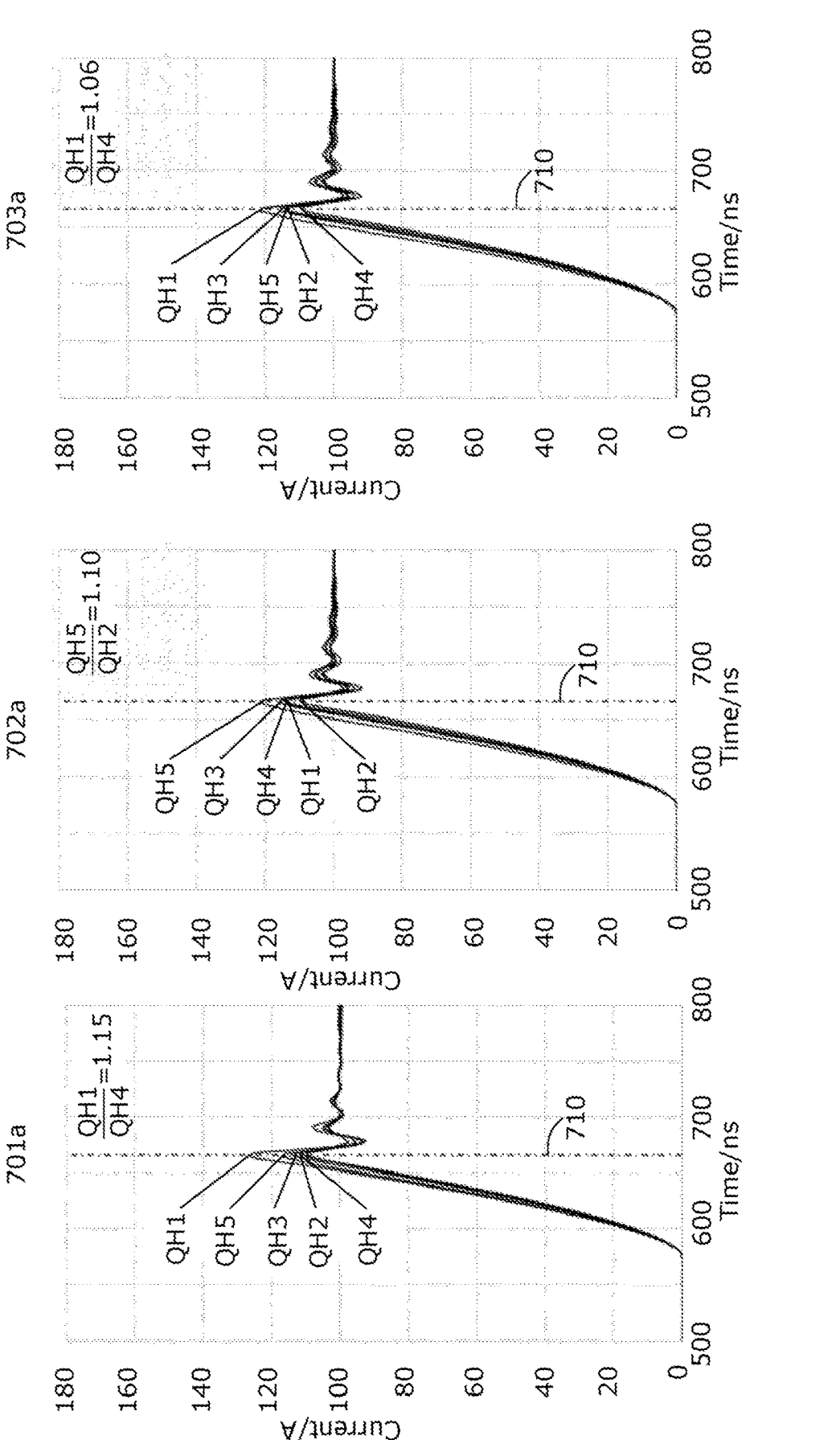
FIG. 7B illustrates exemplary turn-on current switching waveforms of power semiconductor dies of a high-side power switch of the semiconductor package of FIG. 1.

FIG. 7B illustrates circuit simulation results of turn-on currents for each parallel power semiconductor die bonded to vertical source contacts QH1-QH5 for each exemplary copper cladding layer geometries 407*a*, 407*b*, and 407*c* of FIG. 7A.

Illustration 701*a* shows the turn-on currents for QH1~QH5 for copper cladding circuit 407*a*. QH1 exhibits the highest peak current at a time indicated by line 710. At time instant 710, the ratio of the highest turn on current for QH1 over the lowest turn on current for QH5 is 1.15.

Illustration 702*a* shows the turn-on currents for QH1~QH5 for copper cladding circuit 407*b*. At time instant 710, the ratio of the highest turn on current for QH1 over the lowest turn on current for QH5 is reduced to 1.10.

Illustration 703*a* shows the turn-on currents for QH1~QH5 for copper cladding circuit 407*c*. At time instant

610, the ratio of the highest turn on current for QH1 over the lowest turn on current for QH1 is reduced to 1.06.

Exemplary embodiments of the present invention incorporating exemplary isolating slots 701, 702, and 703 of the present invention provide a balanced current sharing between exemplary parallel power semiconductor transistor dies 401 during dynamic switching conditions. Balanced current sharing minimizes differential switching losses between exemplary power semiconductor transistor dies 401 resulting in uniform power semiconductor transistor die 401 temperatures and improved efficiency.

Figure 8:
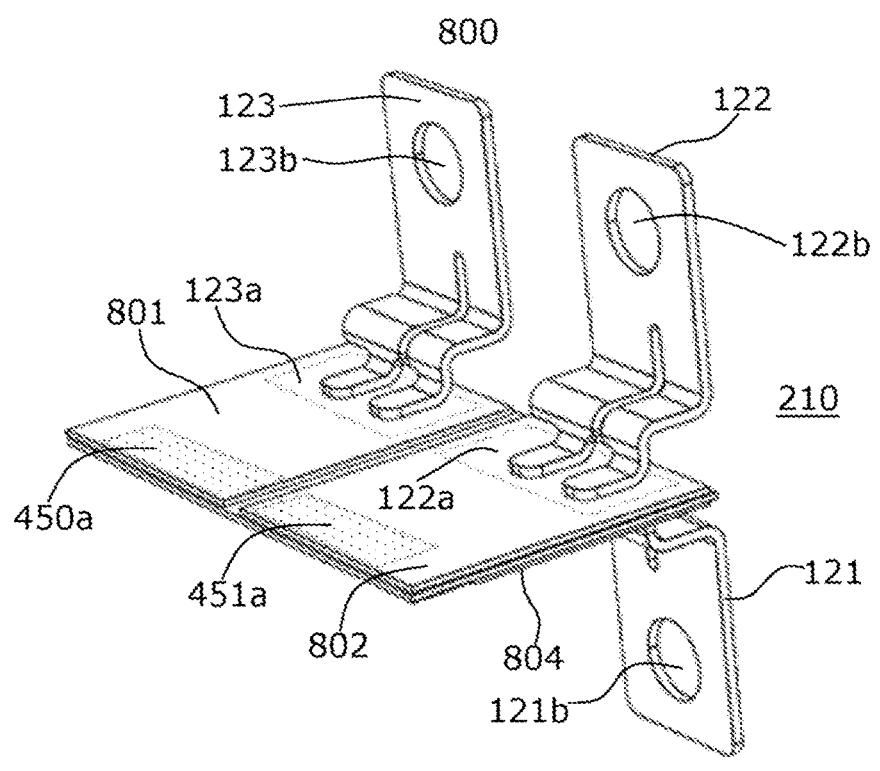
FIG. 8 illustrates two perspective views of the power terminal assembly of the semiconductor package of FIG. 1, which show a top side and a bottom side of the power terminal assembly.
Figure 8:
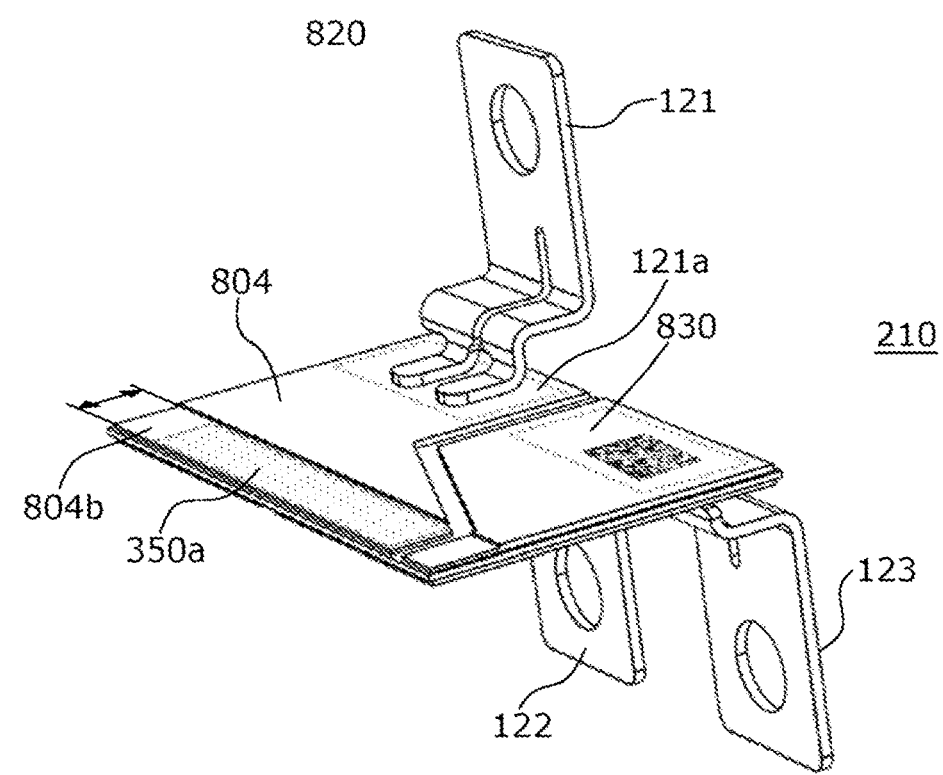

FIG. 8 illustrates the top side 800 and bottom side 820 of an exemplary structure of a power terminal assembly 210 according to certain embodiments of the present invention. Power terminal assembly 210 comprises a power terminal substrate 211 and three power terminals 121~123.

In certain exemplary embodiments, such power terminal substrate 211 may be a direct-bonded-copper (DBC) substrate, an active-metal-braze (AMB) substrate, a direct-plated-copper (DPC) substrate, or a double-sided metal-core-printed-circuit-board (MCPCB).

In certain exemplary embodiments, material used for such power terminals 121~123 may be copper or copper alloys.

An exemplary copper cladding layer circuit 801 connects the electrical source circuit 101s of the high-side power switch 101 and the electrical drain circuit 102d of the low-side power switch 102 to mid-point power terminal 123. Bonding area 450a is electrically and mechanically bonded to bonding area 450 of the second substrate assembly 202. Mid-point power terminal 123 is electrically and mechanically bonded to bonding area 123a.

An exemplary second copper cladding layer circuit 804 connects the electrical drain circuit 101d of the high-side power switch 101 to high-side drain power terminal 122. Bonding area 451a is electrically and mechanically bonded to mechanical bonding area 451 of the second substrate assembly 202. High-side mid-point drain power terminal 123 is electrically and mechanically bonded to bonding area 122a.

An exemplary second copper cladding layer circuit 804 connects the electrical source circuit 102s of the low-side power switch 102 to low-side source power terminal 121. Bonding area 350a is electrically and mechanically bonded to bonding area 350 of the first substrate assembly 201. Low-side source power terminal 121 is electrically and mechanically bonded to bonding area 121a.

Typical manufacturing thickness tolerances for power terminal substrate 211 materials are on the order of +100 μm. A thickness tolerance on the order of +30 μm is desired to achieve high manufacturing yield when assembling the present invention in mass production. In one exemplary embodiment of the present invention, the thickness of the copper cladding layer circuit 801 may be machined to achieve the desired thickness tolerance of the power terminal substrate 211 across the width 804b of bonding area 350a.

Copper cladding layer area 830 is electrically isolated from all circuits in the power semiconductor package. In certain embodiments of the present invention, such copper cladding layer area 830 may be used to imprint manufacturing traceability information using text, 2D bar codes, or 2D data matrix codes.

In certain exemplary embodiments of the present invention, exemplary power terminals 121~123 may be bonded to the power terminal substrate 211 using sintering. Sintering bonds may be formed using paste or film comprising silver, copper, platinum, palladium, or gold particles, microparticles, or nanoparticles. In other exemplary embodiments, such bonds may be formed using ultrasonic welding, laser welding, or electron-beam welding.

Exemplary embodiments of power terminals 121~123 of the present invention each include a hole 121b, 122b, 123b used connect such power terminals with bolts to external busbars. Other exemplary embodiments of such power terminals may omit such holes with bonds to external busbars formed using ultrasonic welding, laser welding, or electron-beam welding. In other exemplary embodiments of the present invention power terminals 121~123 may be omitted from the power semiconductor package. In such embodiments, the external busbars may be directly bonded to copper cladding layer bonding areas 121a, 122a, and 123a using ultrasonic welding, laser welding, or electron-beam welding.

Figure 9:
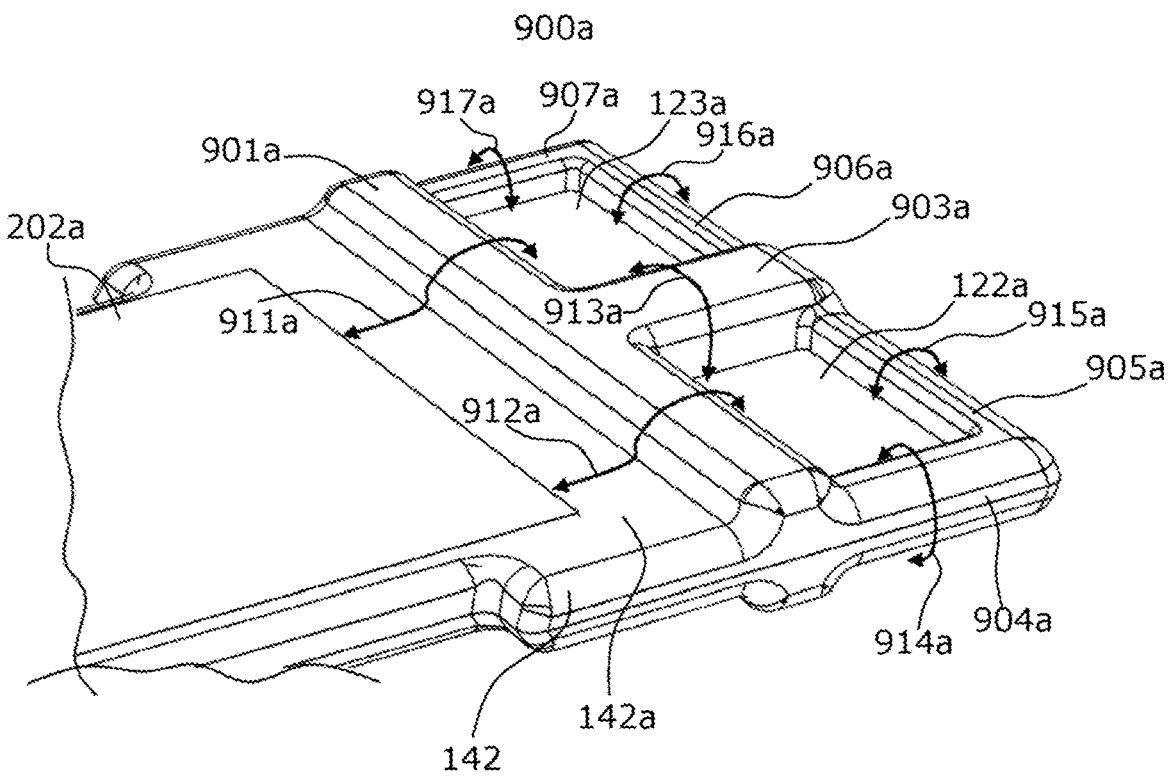
FIG. 9 illustrates two perspective views of a power terminal substrate plastic encapsulant body of the semiconductor package of FIG. 1, which show a top side and a bottom side of the power terminal substrate plastic encapsulant body.
Figure 9:
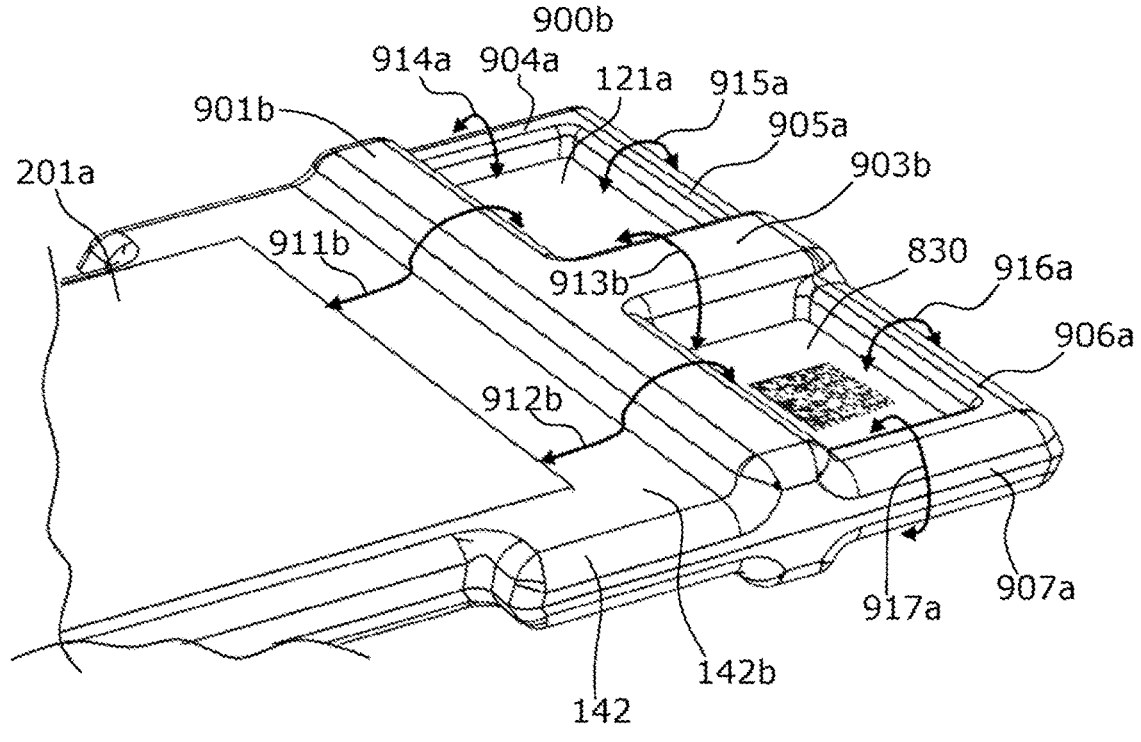

FIG. 9 illustrates the structure of an exemplary power terminal substrate 211 plastic encapsulant body 142 according to certain embodiments of the present invention.

Illustration 900a shows an exemplary embodiment of the top side of such plastic encapsulant body 142 of the present invention. The external copper cladding layer 202a covers a surface of the second substrate assembly 202; surfaces of power terminal bonding areas 122a and 123a are not encapsulated by the plastic encapsulant body 142. The surface 142a of the plastic encapsulant body 142 is recessed relative to the external copper cladding layer 202a surface to support obstruction free bonding of a heat sink to external copper cladding layer 202a.

The exemplary plastic encapsulant body 142 forms a ridge 901a across the width of the power semiconductor package. The ridge 901a is elevated relative to the plastic encapsulant body 142 surface 142a. An advantage of the exemplary ridge 901a is an extension of the electrical creepage dimensions 911a and 912a between the exposed external copper cladding layer 202a and the exposed power terminal bonding areas 122a and 123a of the power terminal substrate 211.

The exemplary plastic encapsulant body 142 forms a second ridge 903a between the power terminal bonding areas 122a and 123a. An advantage of the exemplary second ridge 903a is an extension of the electrical creepage dimension 913a between the exposed bonding areas 122a and 123a of the power terminal substrate 211.

The exemplary plastic encapsulant body 142 forms additional ridges 904a, 905a, 906a, and 907a around the periphery of the power terminal substrate 211. An advantage of the exemplary ridges 904a~907a is an extension of the electrical creepage dimensions 914a, 915a, 916a, and 917a between the exposed copper cladding layers on the top and bottom sides of the power terminal substrate 211.

Illustration 900b shows an exemplary illustration of the bottom side of the plastic encapsulant body 142. The bottom side of the plastic encapsulant body 142 is symmetrical to the top side of the plastic encapsulant body 142. Surface 142b is complementary to surface 142a in illustration 900a. Ridges 901b and 903b are complementary to ridges 901a and 903a in illustration 900a. Creepage dimensions 911b, 912b, and 913b are complementary to dimensions 911a, 912a, and 912a in illustration 900a.

Another advantage of exemplary ridges 901a, 903a, 904a, 905a, 906a, 907a, 901b, and 903b of the plastic encapsulant body 142 is improved mechanical support for the power terminal substrate 211.

Figure 10:
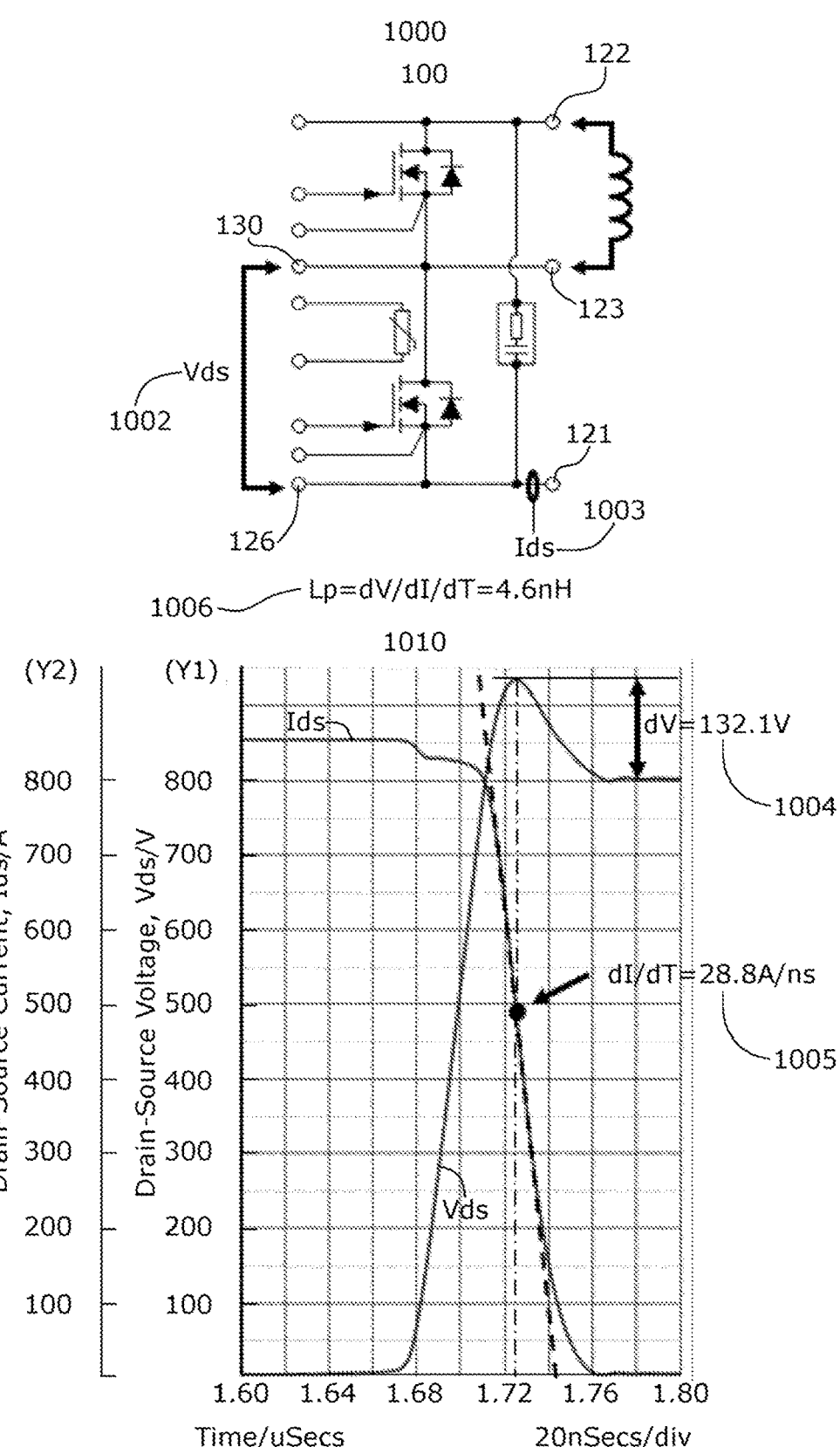
FIG. 10 illustrates the schematic electrical circuit diagram of FIG. 1 with indication of a drain-source voltage and a drain-source current of the low-side power switch of the semiconductor package of FIG. 1, and illustrates exemplary turn-off waveforms of the drain-source voltage and the drain-source current of the low-side power switch.

FIG. 10 illustrates exemplary power module low-side switch drain-source voltage and current turn-off waveforms according to certain embodiments of the present invention.

Additional advantages of the exemplary embodiment of the power terminal assembly 210 of the present invention include low parasitic power loop inductance and low power semiconductor package resistance.

The first copper cladding layer circuit 802 conducting current to the drain 101d of the high-side power switch 101 substantially overlaps the second copper cladding layer circuit 804 conducting current to the electrical source current 102s of the low-side power switch 102. Circuits 802 and 804 are further separated by a very thin power terminal substrate 211 electrical insulation layer 211b. The overlap and close geometric proximity of circuits 802 and 804 causes strong mutual inductance coupling between circuits 802 and 804 resulting in a reduction of the power loop inductance.

Two of the three power terminals 122 and 123 are bonded to one side of the power terminal substrate 211 with the third power terminal bonded to opposite side of the power terminal substrate 211. The effect of this arrangement is that each power terminal can be made 33% wider for a given power semiconductor package width compared with power semiconductor packages having three power terminals adjacent to each other. The achievable 33% increase in power terminal width from the exemplary embodiment of the present invention results in lower resistance of the power terminals. The reduction in the power terminal resistance combined with the present invention not having any bond wires in the power loop results in a very low power semiconductor package resistance of less than 0.075 milliOhm for the disclosed exemplary embodiment.

Illustration 1000 of FIG. 10 shows a simplified schematic of the power semiconductor half-bridge circuit 100 of the present invention. A low-side power switch 102 turn-off switching transient is simulated with an inductive load between power terminals 122 and 123 for a drain-source current of 850 A and drain-source voltage of 800V. The drain-source voltage 1002 of the low-side power switch 102 is measured across signal terminals 130 and 126. The drain-source current 1003 is measured at low-side source power terminal 121. Illustration 1010 shows the low-side power switch 102 drain-source voltage and drain-source current during such turn-off switching transient. The measured voltage overshoot magnitude 1004 and measured rate of change of current 1005 at time of the occurrence of the peak voltage correspond to a power loop inductance 1006 of 4.6 nH.

Figure 11:
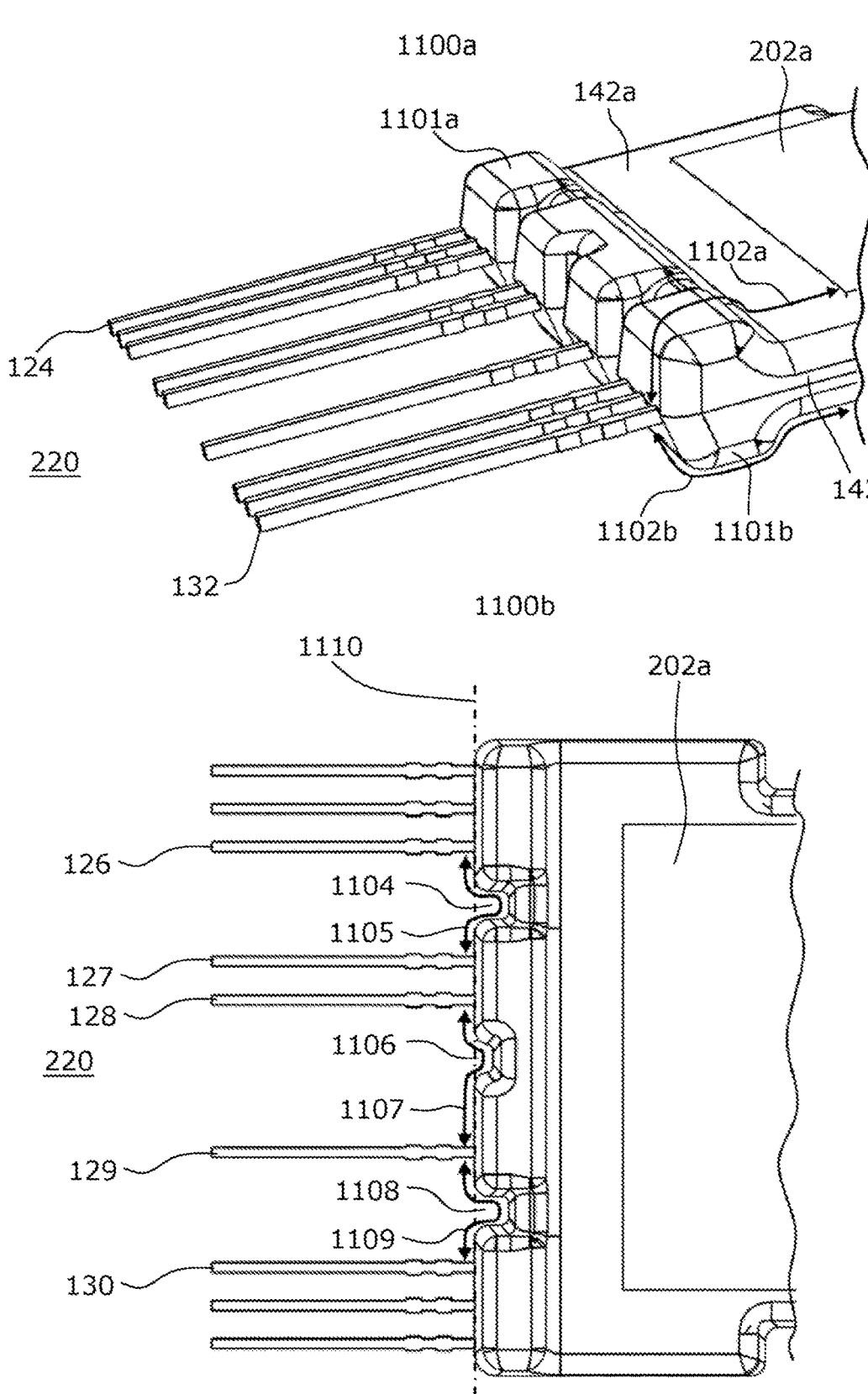
FIG. 11 illustrates a perspective view and a top view of a signal terminals plastic encapsulant body which encapsulates a plurality of signal terminals of the semiconductor package of FIG. 1.

FIG. 11 illustrates the structure of an exemplary signal terminal lead frame 220 plastic encapsulant body 142 according to certain embodiments of the present invention.

Illustration 1100a shows an exemplary embodiment of one side of such plastic encapsulant body 142 of the present invention. The plastic encapsulant body 142 partially encapsulates the exemplary signal terminals 124~132 to mechanically support the signal terminals and to provide electrical creepage isolation. The external copper cladding layer 202a surfaces of the second substrate assembly 202 and the external copper cladding layer 201a (not shown) of the first substrate assembly 201 are not encapsulated by the plastic encapsulant body 142. The surface 142a of plastic encapsulant body 142 is recessed relative to external copper cladding layer 202a surface to support obstruction free bonding of a heat sink to external copper cladding layer 202a.

The exemplary plastic encapsulant body 142 forms a ridge 1101a substantially across the width of the power semiconductor package. The ridge 1101a is elevated relative to the surface 142a of the plastic encapsulant body 142. An advantage of the exemplary ridge 1101a is an extension of the exemplary electrical creepage dimensions 1102a between the exposed external copper cladding layer 202a and the exposed signal terminals 123~132. In certain embodiments, the plastic encapsulant body 142 structure is symmetrical on the opposite side of the power semiconductor package (not shown). Ridge 1101b formed by the encapsulant body on the opposite side of the power semiconductor package of the present invention is symmetrical in structure to ridge 1101a.

Illustration 1100b shows an exemplary plurality of notches 1104, 1106, and 1108 indented relative to the edge 1110 of the plastic encapsulant body 142.

Exemplary notch 1104 extends the creepage dimension 1105 between the low-side electrical source circuit 102s signal terminal 126 and thermistor 104 signal terminal 127 required for safe high-voltage electrical isolation of the thermistor circuit.

Exemplary notch 1106 extends the creepage dimension 1107 between the high-side drain circuit 101d signal terminal 129 and thermistor 104 signal terminal 128 required for safe high-voltage electrical isolation of the thermistor circuit.

Exemplary notch 1108 extends the creepage dimension 1109 between the high-side drain circuit 101d signal terminal 129 and the high-side electrical source circuit 101s signal terminal 130 required for safe high-voltage electrical isolation of the thermistor circuit.

An advantage of the exemplary embodiment of the present invention having a plurality of such plastic encapsulant body 142 notches 1104, 1106 and 1108 is a 16% reduction of the required power semiconductor package width relative to a package having no notches, resulting in a smaller and higher power density power semiconductor package.

As used herein, the terms "comprises", "comprising", "includes", "including", "has", "having" or any contextual variants thereof, are intended to cover a non-exclusive inclusion. For example, a process, product, article, or apparatus that comprises a list of elements is not necessarily limited to only those elements, but may include other elements not expressly listed or inherent to such process, product, article, or apparatus. Further, unless expressly stated to the contrary, "or" refers to an inclusive or and not to an exclusive or. For example, a condition "A or B" is satisfied by any of the following: A is true (or present) and B is false (or not present), A is false (or not present) and B is true (or present), and both A and B is true (or present).

It will also be appreciated that one or more of the elements depicted in the drawings/figures can also be implemented in a more separated or integrated manner, or even removed or rendered as inoperable in certain cases, as is useful in accordance with a particular application. Reference should also be had to the appended claims.

LIST OF REFERENCE CHARACTERS

100 Power semiconductor half-bridge circuit
101 High-side power switch
101d Drain (of high-side power switch 101)/Electrical drain circuit/High-side drain terminal
101g Common electrical gate circuit
101s Electrical source current (of high-side power switch 101)/Electrical source circuit
102 Low-side power switch
102d Drain (of low-side power switch 102)/Electrical drain circuit
102g Common electrical gate circuit

19

102*s* Electrical source current (of low-side power switch 102)/Electrical source circuit
103 RC snubber capacitor
104 Thermistor
104*x* Copper cladding layer
121 Low-side drain power terminal
121*a* Bonding area
121*b* Hole
122 High-side drain power terminal
122*a* Bonding area
122*b* Hole
123 Mid-point power terminal
123*a* Bonding area
123*b* Hole
124 Signal terminal/First signal terminal
124*a* Bonding area
124*m* Bonding area
125 Signal terminal
125*a* Bonding area
125*m* Bonding area
126 Signal terminal/Low-side source common signal terminal
126*a* Bonding area
126*m* Bonding area
127 Signal terminal
127*a* Bonding area
127*m* Bonding area
128 Signal terminal
128*a* Bonding area
128*m* Bonding area
129 Signal terminal/High-side drain signal terminal
129*a* Bonding area
129*m* Bonding area
130 Signal terminal/High-side source/low-side drain signal terminal/High-side common source signal terminal/ Low-side source signal terminal
130*a* Bonding area
130*m* Bonding area
131 Signal terminal/External Kelvin source signal terminal
131*a* Bonding area
131*m* Bonding area
132 Signal terminal/Last signal terminal
132*a* Bonding area
140 Bottom side heatsink
141 Top side heatsink
142 Plastic encapsulant body
142*a* Surface (of plastic encapsulant body 142)
142*b* Surface
150 Final power semiconductor package structure
201 First substrate assembly
201*a* External copper cladding layer
201*b* Electrical isolation layer
201*c* Internal copper cladding layer
202 Second substrate assembly
202*a* External copper cladding layer
202*b* Electrical isolation layer
202*c* Internal copper cladding layer
210 Power terminal assembly
211 Power terminal substrate
211*a* First copper cladding layer
211*b* Electrical insulation layer
211*c* Second copper cladding layer
220 Signal terminal lead frame
301 Power semiconductor transistor die
302 Vertical source contact
303 Resistor

20

304 Vertical power contact
306 Copper cladding layer circuit
306*a* Copper cladding circuit
306*b* Copper cladding circuit
306*c* Copper cladding circuit
307 Copper cladding layer circuit
308 Copper cladding layer circuit
309 Copper cladding layer circuit
350 Bonding area
350*a* Bonding area
401 Power semiconductor transistor die
402 Vertical source contact
403 Resistor
407 Copper cladding layer circuit
407*a* Copper cladding circuit
407*b* Copper cladding circuit
407*c* Copper cladding layer circuit
408 Copper cladding layer circuit
409 Copper cladding layer circuit
410 Copper cladding layer circuit
411 Copper cladding circuit
412 Copper cladding layer circuit
450 Bonding area
450*a* Bonding area
451 Mechanical bonding area
451*a* Bonding area
501 Isolating slot
502 Isolating slot
503 Isolating slot
510 Bond position
511 Bond position
512 Bond position
513 Bond position
514 Bond position
515 Bond position
516 Bond position
517 Bond position
604 Dashed line
701 First isolating slot
702 Second isolating slot
703 Third isolating slot
704 Dashed line
705 Continuous span
710 Time
800 Top side
801 Copper cladding layer circuit
802 First copper cladding layer circuit
804 Second copper cladding layer circuit
804*b* Width (of bonding area 350*a*)
820 Bottom side
830 Copper cladding layer area
901*a* Ridge
901*b* Ridge
903*a* Second ridge
903*b* Ridge
904*a* Additional ridge
905*a* Additional ridge
906*a* Additional ridge
907*a* Additional ridge
911*a* Electrical creepage dimension
911*b* Creepage dimension
912*a* Electrical creepage dimension
912*b* Creepage dimension
913*a* Electrical creepage dimension
913*b* Creepage dimension
914*a* Electrical creepage dimension
915*a* Electrical creepage dimension 916a Electrical creepage dimension
917a Electrical creepage dimension
1002 Drain-source voltage
1003 Drain-source current
1004 Measured voltage overshoot magnitude
1005 Measured rate of change of current
1006 Power loop inductance
1101a Ridge
1101b Ridge
1102a Electrical creepage dimension
1102b Creepage dimension
1104 Notch
1105 Creepage dimension
1106 Notch
1107 Creepage dimension
1108 Notch
1109 Creepage dimension
1110 Edge
Ids Drain source current
QL1 Vertical source contact
QL2 Vertical source contact
QL3 Vertical source contact
QL4 Vertical source contact
QL5 Vertical source contact
QH1 Vertical source contact
QH2 Vertical source contact
QH3 Vertical source contact
QH4 Vertical source contact
QH5 Vertical source contact
Vds Drain source voltage
What is claimed is:

1. A power semiconductor package which defines a half-bridge electrical circuit comprising a high-side power switch and a low-side power switch, the power semiconductor package comprising:
    a first substrate assembly which comprises at least one power semiconductor die which defines the high-side power switch;
    a second substrate assembly which is arranged substantially parallel to the first substrate assembly and which comprises at least one power semiconductor die which defines the low-side power switch; and
    a power terminal assembly which comprises,
        a power terminal substrate which is arranged between the first substrate assembly and the second substrate assembly,
        a high-side drain power terminal which is electrically connected to an electrical drain circuit of the high-side power switch, a low-side source power terminal which is electrically connected to an electrical source circuit of the low-side power switch, and
    a mid-point power terminal which is electrically connected to an electrical source circuit of the high-side power switch and to an electrical drain circuit of the low-side power switch,
    wherein,
    the high-side drain power terminal, the low-side source power terminal, and the mid-point power terminal are each arranged on the power terminal substrate.

2. The power semiconductor package as recited in claim 1, wherein,
    the power terminal assembly further comprises a copper cladding layer which defines a bonding area, and
    the bonding area of the copper cladding layer is machined so as to have a thickness tolerance of no more than ±50 μm.

3. The power semiconductor package as recited in claim 2, wherein the thickness tolerance is no more than ±30 μm.

4. The power semiconductor package as recited in claim 1, wherein the high-side drain power terminal and the low-side source power terminal are arranged on opposite sides of the power terminal substrate.

5. The power semiconductor package as recited in claim 4, wherein the power terminal assembly further comprises:
    a high-side drain power terminal copper cladding layer circuit which is arranged on a first side of the power terminal substrate and which is electrically connected to the high-side drain power terminal; and
    a low-side source power terminal copper cladding layer circuit which is arranged on a second side of the power terminal substrate, the second side of the power terminal substrate being opposite the first side of the power terminal substrate, and which is electrically connected to the low-side source power terminal,
    wherein,
    the high-side drain power terminal copper cladding layer circuit and the low-side source power terminal copper cladding layer circuit are arranged so that an orthogonal projection of the high-side drain power terminal copper cladding layer circuit onto a surface of the power terminal substrate, and an orthogonal projection of the low-side source power terminal copper cladding layer circuit onto the surface of the power terminal substrate, overlap.

* * * * *